United States Patent
Lee et al.

(10) Patent No.: US 10,008,270 B2
(45) Date of Patent: Jun. 26, 2018

(54) NON-VOLATILE MEMORY DEVICE AND PROGRAMMING METHOD THEREOF

(71) Applicant: Samsung Electronics Co., Ltd., Suwon-si, Gyeonggi-do (KR)

(72) Inventors: Yo-han Lee, Incheon (KR); Ji-suk Kim, Seoul (KR); Chang-yeon Yu, Hwaseong-si (KR); Jin-young Chun, Seoul (KR); Se-heon Baek, Seoul (KR); Jun-young Ko, Seoul (KR); Seong-ook Jung, Seoul (KR); Ji-su Kim, Incheon (KR)

(73) Assignees: SAMSUNG ELECTRONICS CO., LTD., Gyeonggi-Do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days. days.

(21) Appl. No.: 15/383,408

(22) Filed: Dec. 19, 2016

(65) Prior Publication Data
US 2017/0287561 A1    Oct. 5, 2017

(30) Foreign Application Priority Data
Apr. 4, 2016    (KR) .................. 10-2016-0040942

(51) Int. Cl.
| G11C 11/34 | (2006.01) |
| G11C 16/10 | (2006.01) |
| G11C 16/04 | (2006.01) |
| G11C 16/24 | (2006.01) |
| G11C 16/34 | (2006.01) |
| G11C 11/56 | (2006.01) |

(52) U.S. Cl.
CPC .......... *G11C 16/10* (2013.01); *G11C 11/5628* (2013.01); *G11C 16/0466* (2013.01); *G11C 16/0483* (2013.01); *G11C 16/24* (2013.01); *G11C 16/3459* (2013.01)

(58) Field of Classification Search
CPC . G11C 16/10; G11C 16/0466; G11C 16/0483; G11C 16/08; G11C 16/24; G11C 16/3459
USPC ..................................................... 365/185.05
See application file for complete search history.

(56) References Cited

U.S. PATENT DOCUMENTS

| 6,108,238 | A  | 8/2000  | Nakamura et al. |
| 7,586,157 | B2 | 9/2009  | Mokhlesi et al. |
| 7,652,929 | B2 | 1/2010  | Li              |
| 7,679,133 | B2 | 3/2010  | Son et al.      |
| 7,995,394 | B2 | 8/2011  | Donq et al.     |

(Continued)

*Primary Examiner* — Fernando Hidalgo
(74) *Attorney, Agent, or Firm* — Harness, Dickey & Pierce, P.L.C.

(57) ABSTRACT

A programming method of a non-volatile memory device including a plurality of memory cells arranged in a plurality of cell strings includes sequentially applying a first pass voltage to unselected word lines of word lines connected to the plurality of memory cells during a first interval and a second pass voltage higher than the first pass voltage to the unselected word lines during a second interval; and applying a discharge voltage lower than a program voltage to a selected word line of the word lines connected to the plurality of memory cells after applying the program voltage to the selected word line in the first interval, and applying the program voltage to the selected word line during the second interval.

19 Claims, 27 Drawing Sheets

(56) References Cited

U.S. PATENT DOCUMENTS

| | | |
|---|---|---|
| 8,050,088 B2 | 11/2011 | Lee |
| 8,116,140 B2 | 2/2012 | Donq et al. |
| 8,488,381 B2 | 7/2013 | Kim et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,854,890 B1 | 10/2014 | Miwa |
| 8,873,293 B1 | 10/2014 | Ou et al. |
| 9,646,701 B2 * | 5/2017 | Lee .................. G11C 16/10 |
| 2011/0233648 A1 | 9/2011 | Seol et al. |
| 2013/0044544 A1 | 2/2013 | Shiino et al. |
| 2013/0077407 A1 * | 3/2013 | Koo .................. G11C 16/10 |
| | | 365/185.22 |
| 2014/0334232 A1 | 11/2014 | Nam et al. |
| 2017/0213586 A1 * | 7/2017 | Kang ................ G06F 3/0619 |
| 2017/0271023 A1 * | 9/2017 | Maejima ............ G11C 16/28 |

* cited by examiner

FIG. 6

| Selected BL | VSS |
|---|---|
| Unselected BL | VCC |
| Selected SSL | VCC |
| Unselected SSL | VSS |
| Selected WL | VPGM |
| Unselected WL | $V_{pass1} \rightarrow V_{pass2}$ |
| GSL | VSS |
| Substrate | VSS |

NON-VOLATILE MEMORY DEVICE AND PROGRAMMING METHOD THEREOF

CROSS-REFERENCE TO RELATED APPLICATION

This application claims the benefit of Korean Patent Application No. 10-2016-0040942, filed on Apr. 4, 2016, in the Korean Intellectual Property Office, the disclosure of which is incorporated herein in its entirety by reference.

BACKGROUND

1. Field

At least some example embodiments of the inventive concepts relate to a semiconductor memory device, and more particularly, to a programming method of a non-volatile memory device in which memory cells are programmed to have threshold voltages having desired threshold voltage distributions using a program voltage having a discharge interval.

2. Description of the Related Art

Semiconductor memory devices may be largely divided into volatile memory devices and non-volatile memory devices. The volatile memory devices may lose stored data when power supply is interrupted. The volatile memory devices include a static random access memory (SRAM), a dynamic RAM (DRAM), and the like.

The non-volatile memory devices have a characteristic in which stored data is maintained as is even when power supply is interrupted. Due to this characteristic, the non-volatile memory devices may be used as storage media and the like which are mounted on portable and/or electronic products. The non-volatile memory devices include a flash memory device, a phase-change RAM (PRAM), a magnetic RAM (MRAM), a resistive RAM (RRAM), a ferroelectric RAM (FRAM), and the like. The flash memory device is being widely used as a memory device of an electronic product such as a smart phone, a digital camera, a solid state drive (SSD), and the like.

In order to improve a degree of integration of a semiconductor memory device, a flash memory device in which memory cells are three-dimensionally (3D) stacked is being researched. In 3D flash memory devices, parasitic resistance and capacitance differences between word lines may occur. Due to the parasitic resistance and capacitance differences, a problem in that a program voltage of a selected memory cell is overshot or a program voltage setup time is lengthened in a program operation of the flash memory device may occur. This problem results in degradation of the program performance of the flash memory device.

SUMMARY

At least some example embodiments of the inventive concepts provide a programming method of a non-volatile memory device in which program performance is improved using a program voltage having a discharge interval.

According to at least some example embodiments of the inventive concepts, a programming method of a non-volatile memory device including a plurality of memory cells arranged in a plurality of cell strings includes sequentially applying a first pass voltage to unselected word lines of word lines connected to the plurality of memory cells during a first interval and a second pass voltage higher than the first pass voltage to the unselected word lines during a second interval; and applying a discharge voltage lower than a program voltage to a selected word line of the word lines connected to the plurality of memory cells after applying the program voltage to the selected word line in the first interval, and applying the program voltage to the selected word line during the second interval.

According to at least some example embodiments of the inventive concepts, a non-volatile memory device includes a memory cell array including a plurality of memory cells arranged in a plurality of cell strings; an address decoder that is, connected to the plurality of memory cells of the plurality of cell strings through word lines, connected to string selection transistors of the plurality of cell strings through a string selection line, and connected to ground selection transistors of the plurality of cell strings through a ground selection line; and a program control logic configured cause, in a program operation, a first pass voltage to be applied to unselected word lines of the word lines during a first interval, a second pass voltage higher than the first pass voltage to be applied to the unselected word lines during a second interval, a discharge voltage lower than a program voltage to be applied to a selected word line of the word lines after the program voltage is applied to the selected word line during the first interval, and the program voltage to be applied to the selected word line during the second interval.

According to at least some example embodiments of the inventive concepts, a method includes selecting a word line, from among a plurality of word lines of a non-volatile memory device, each word line of the plurality of word lines being connected to memory cells from among a plurality of non-volatile memory cells of the non-volatile memory device; performing, over first, second, and third sequential time intervals, a programming operation on memory cells connected to the selected word line by, applying a program voltage to the selected word line during the first time interval, applying a discharge voltage that is lower than the first program voltage to the selected word line during the second time interval, and applying a voltage that is higher than the discharge voltage to the selected word line during the third time interval, and applying a first pass voltage to unselected word lines during the first time interval, applying a second pass voltage that is higher than the first pass voltage to the unselected word lines during the third time interval, and applying a voltage that is lower than the second pass voltage to the unselected word lines during the second time interval, the unselected word lines being word lines, from among the plurality of word lines, other than the selected word line.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 6 is a table illustrating voltage conditions applied to the memory cell array of FIG. 3 during a program operation;

DETAILED DESCRIPTION OF THE EMBODIMENTS

Figure 1:
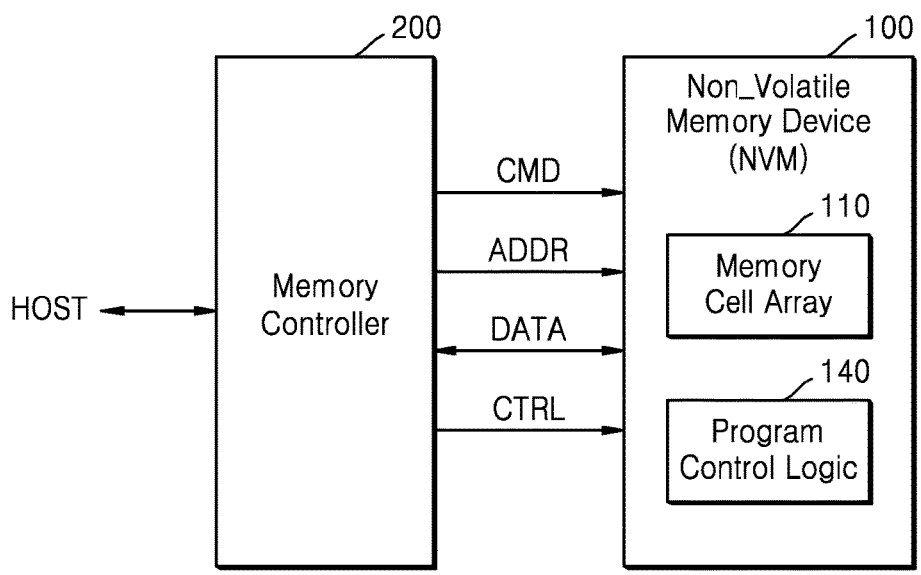
FIG. 1 is a block diagram schematically illustrating a memory system according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram schematically illustrating a memory system according to at least one example embodiment of the inventive concepts.

Referring to FIG. 1, a memory system 10 may include a non-volatile memory device 100 and a memory controller 200 which controls the non-volatile memory device 100. The non-volatile memory device 100 may be a flash memory device, for example, an NAND flash memory device. However, it should be understood that at least some example embodiments of the inventive concepts are not limited to the NAND flash memory device.

The non-volatile memory device 100 may include a memory cell array 110 having memory cells which are arranged in rows (word lines) and columns (bit lines). Each of the memory cells may store 1-bit data (a single-bit) or M-bit data (multiple bits, where M is 2 or 2 or more). Each of the memory cells may be implemented as a memory cell having a charge storage layer such as a floating gate or a charge trapping layer, a memory cell having a variable resistor, or the like.

The memory cell array 110 may be implemented to have a single-layer array structure (a two-dimensional (2D) array structure) or a multi-layer array structure (a three-dimensional (3D) array structure). A 3D memory array is formed on an active area, which is disposed on a silicon substrate, at a physical level of at least one of memory cell arrays having circuits formed on the substrate or in the substrate serving as circuits related to operations of memory cells in a monolithic manner. The term "monolithic" means that layers of each level constituting the array are directly stacked on layers of each lower level of the array.

According to at least one example embodiment of the inventive concepts, the 3D memory array includes NAND strings disposed in a vertical direction so that at least one memory cell is located on another memory cell. At least one memory cell may include a charge trapping layer. U.S. Pat. Nos. 7,679,133, 8,553,466, 8,654,587, and 8,559,235, and United States Patent Application Publication No. 2011-0233648, the entire contents of each of which are incorporated herein by reference, describe appropriate components of a 3D memory array including a plurality of levels and word lines and/or bit lines shared between levels. Further, the entire contents of United States Patent Application Publication No. 2014-0334232 and U.S. Pat. No. 8,488,381 are incorporated herein by reference.

The memory controller 200 may communicate with a host through various interfaces. The memory controller 200 may communicate with, for example, the host through one of various interfaces examples of which include, but are not limited to, a Universal Serial Bus (USB) interface, a MultiMedia Card (MMC) interface, a peripheral component interconnect express (PCI-E) interface, an advanced technology attachment (ATA) interface, a serial ATA (SATA) interface, a parallel ATA (PATA) interface, a serial attached small computer system (SAS) interface, a small computer system interface (SCSI), an embedded MMC (eMMC) interface, and an enhanced small disk interface (ESDI).

The memory controller 200 may control the non-volatile memory device 100 so as to read data DATA stored in the non-volatile memory device 100 or to write the data DATA to the non-volatile memory device 100 in response to read/write requests from the host. The memory controller 200 may provide a command CMD, an address ADDR, and a control signal CTRL to the non-volatile memory device 100, and control program, read, and erase operations with respect to the non-volatile memory device 100.

The non-volatile memory device 100 may perform the program, erase, and read operations in response to the address ADDR, the command CMD, and the control signal CTRL which are received from the memory controller 200.

A program control logic 140 controls overall operation of the non-volatile memory device 100 according to programming methods according to at least some example embodiments of the inventive concepts. According to at least some example embodiments, the program control logic 140 may control the application of various voltages to selected and/or unselected word lines of the non-volatile memory device 100 by controlling operations of one or both of the voltage generator 150 and the address decoder 120.

For example, the program control logic 140 may sequentially apply a first pass voltage during a first interval and a second pass voltage higher than the first pass voltage during a second interval to unselected word lines of word lines connected to a plurality of memory cells. The program control logic 140 may apply a discharge voltage lower than a program voltage to a selected word line of the word lines connected to the plurality of memory cells after the program voltage is applied thereto during the first interval, and may apply the program voltage thereto during the second interval.

The program control logic 140 may adjust the discharge voltage and the second pass voltage based on a level of the program voltage and a coupling rate between the selected word line and the unselected word lines. In the applying of the discharge voltage applied to the selected word line, the program control logic 140 may adjust an interval in which the discharge voltage is applied, a time point at which the discharge voltage is applied, and a level of the discharge voltage according to the level of the program voltage.

The non-volatile memory device 100 allows a program voltage having a discharge interval to be applied to the selected word line in a program operation, and thus may prevent the program voltage from being overshot or may allow a voltage of a selected word line to which the program voltage is applied to be quickly setup as (i.e., quickly increased to) a target program voltage level even when the voltage of the selected word line WL is coupled to voltages of the unselected word lines to which pass voltages are applied.

According to at least one example embodiment of the inventive concepts, the memory controller 200 and the program control logic 140 may each include or be embodied by one or more circuits or circuitry (e.g., hardware) specifically structured to carry out and/or control some or all of the operations described in the present disclosure as being performed by the memory controller 200 or the program control logic 140 (or an element thereof). According to at least one example embodiment of the inventive concepts, the memory controller 200 and the program control logic 140 may each include or be embodied by a memory and one or more processors executing computer-readable code (e.g., software and/or firmware) that is stored in the memory and includes instructions for causing the one or more processors to carry out and/or control some or all of the operations described herein as being performed by the memory controller 200 or the program control logic 140 (or an element thereof). According to at least one example embodiment of the inventive concepts, the memory controller 200 and the program control logic 140 may each be embodied by, for example, a combination of the above-referenced hardware and processors executing computer-readable code.

Figure 2:
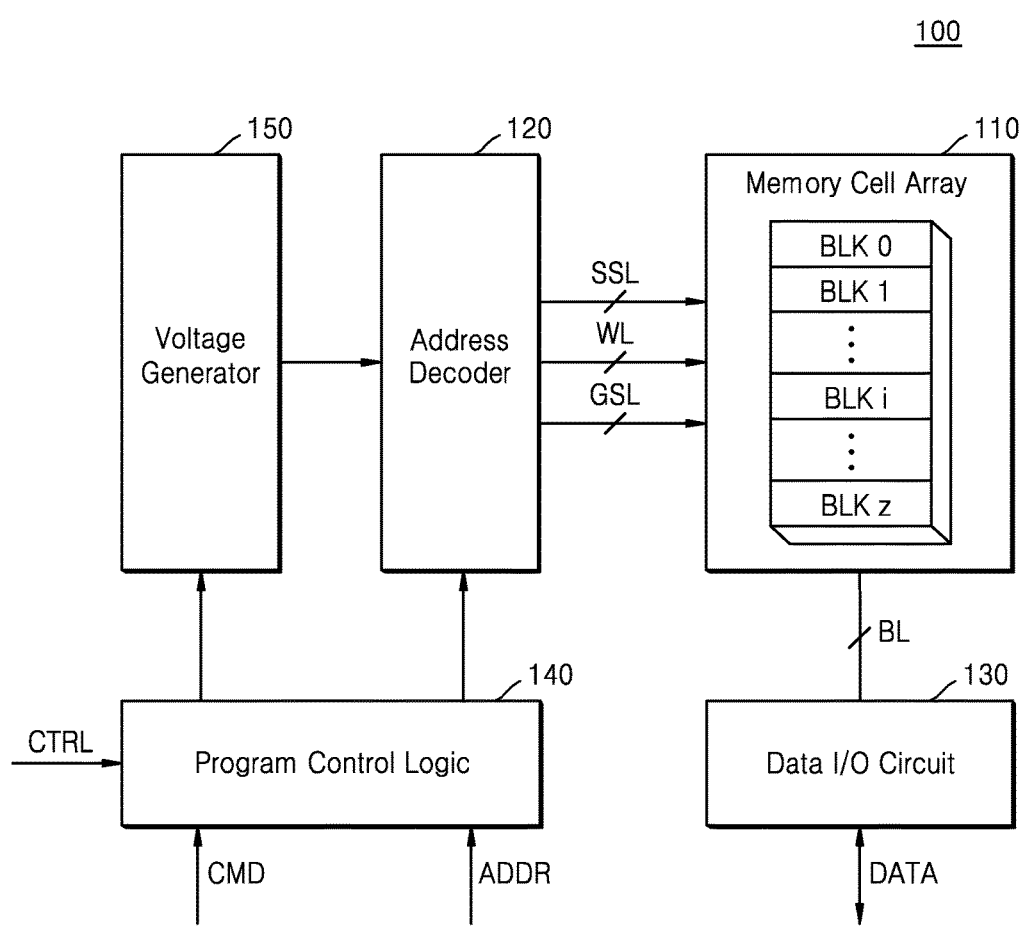
FIG. 2 is a block diagram illustrating a non-volatile memory device included in FIG. 1 in detail.

FIG. 2 is a block diagram illustrating the non-volatile memory device included in FIG. 1 in detail.

Referring to FIG. 2, the non-volatile memory device 100 may include the memory cell array 110, an address decoder 120, a data input-and-output (I/O) circuit 130, the program control logic 140, and a voltage generator 150. The address decoder 120 and voltage generator 150 may each be embodied by circuitry or one or more circuits.

The memory cell array 110 may be connected to word lines WLs, string selection lines SSLs, ground selection lines GSLs, and bit lines BLs. The memory cell array 110 may be connected to the address decoder 120 through the word lines WLs, the string selection lines SSLs, and the ground selection lines GSLs, and to the data I/O circuit 130 through the bit lines BLs. The memory cell array 110 may include a plurality of blocks BLK0 to BLKz.

Each of the blocks BLK0 to BLKz may include a plurality of memory cells and a plurality of selection transistors. The memory cells may be connected to the word lines WLs, and the selection transistors may be connected to the string selection lines SSLs or the ground selection lines GSLs. The memory cells of each of the blocks BLK0 to BLKz may form a 3D structure by being stacked in a direction perpendicular to a substrate. The memory cells of each of the blocks BLK0 to BLKz may be formed as single-level cells which store 1-bit data or as multi-level cells (MLCs) which store multi-bit data.

The address decoder 120 is formed to perform selection and driving operations on rows of the memory cell array 110. The address decoder 120 transfers (e.g., applies) various word line voltages provided from the voltage generator 150 to the word lines. During a program operation, the address decoder 120 transfers (e.g., applies) the program voltage and a verification voltage to a selected word line, and transfers (e.g., applies) a pass voltage to unselected word lines. The pass voltage may be a high voltage. The high voltage may be a voltage having a higher level than a power voltage, which is generated by pumping the power voltage. The program voltage may be a high voltage having a higher level than the pass voltage.

The address decoder 120 transfers (e.g., applies) a selected read voltage provided from the voltage generator 150 to the selected word line, and an unselected read voltage to the unselected word lines during a read operation.

The data I/O circuit 130 is connected to the memory cell array 110 through the bit lines BL. The data I/O circuit 130 receives data DATA from the outside, and stores the received data DATA in the memory cell array 110. Further, the data I/O circuit 130 reads the data DATA stored in the memory cell array 110, and transfers (e.g., applies) the read data to the outside. For example, the data I/O circuit 130 may include components such as a column selection gate, a page buffer, a data buffer, and the like. As another example, the data I/O circuit 130 may include components such as a column selection gate, a write driver, a sense amplifier, a data buffer, and the like.

The program control logic 140 controls overall operation of the non-volatile memory device 100 in a program operating procedure in which the programming methods according to at least some example embodiments of the inventive concepts are used. The program control logic 140 controls so that the first pass voltage is applied to unselected word lines of word lines during the first interval and the second pass voltage higher than the first pass voltage is applied thereto during the second interval, and the discharge voltage lower than the program voltage is applied to a selected word line of the word lines after the program voltage is applied thereto during the first interval and the program voltage is applied thereto during the second interval in the program operation.

The program control logic 140 may adjust the discharge voltage applied to the selected word line based on a level of the program voltage of the selected word line and a coupling rate between the selected word line and the unselected word lines. The program control logic 140 may adjust so that an interval in which the discharge voltage is applied is lengthened, a time point at which the discharge voltage is applied is advanced (i.e., made to be sooner), and/or a level of the discharge voltage is increased when the level of the program voltage is increased.

The program control logic 140 may adjust the second pass voltage applied to the unselected word lines based on the level of the program voltage of the selected word line and the coupling rate between the selected word line and the unselected word lines. The program control logic 140 may control the second pass voltage so that its level is increased when the level of the program voltage is increased.

The voltage generator 150 is formed to generate various voltages required in the non-volatile memory device 100. The voltage generator 150 may generate various voltages required in the program control logic 140 to provide the generated voltages to the address decoder 120.

The voltage generator 150 is connected to the address decoder 120 so that a ground voltage VSS is supplied to a ground selection line GSL, a power voltage VCC is supplied to a selected string selection line SSL, the ground voltage VSS is supplied to unselected string selection lines SSLs, a program voltage VPGM is applied to a selected word line WL, first and second pass voltages $V_{pass1}$ and $V_{pass2}$ are applied to unselected word lines WLs, the ground voltage VSS is supplied to a selected bit line BL, and the power voltage VCC is supplied to unselected bit lines BLs in a program operation of the non-volatile memory device 100.

Figure 3:
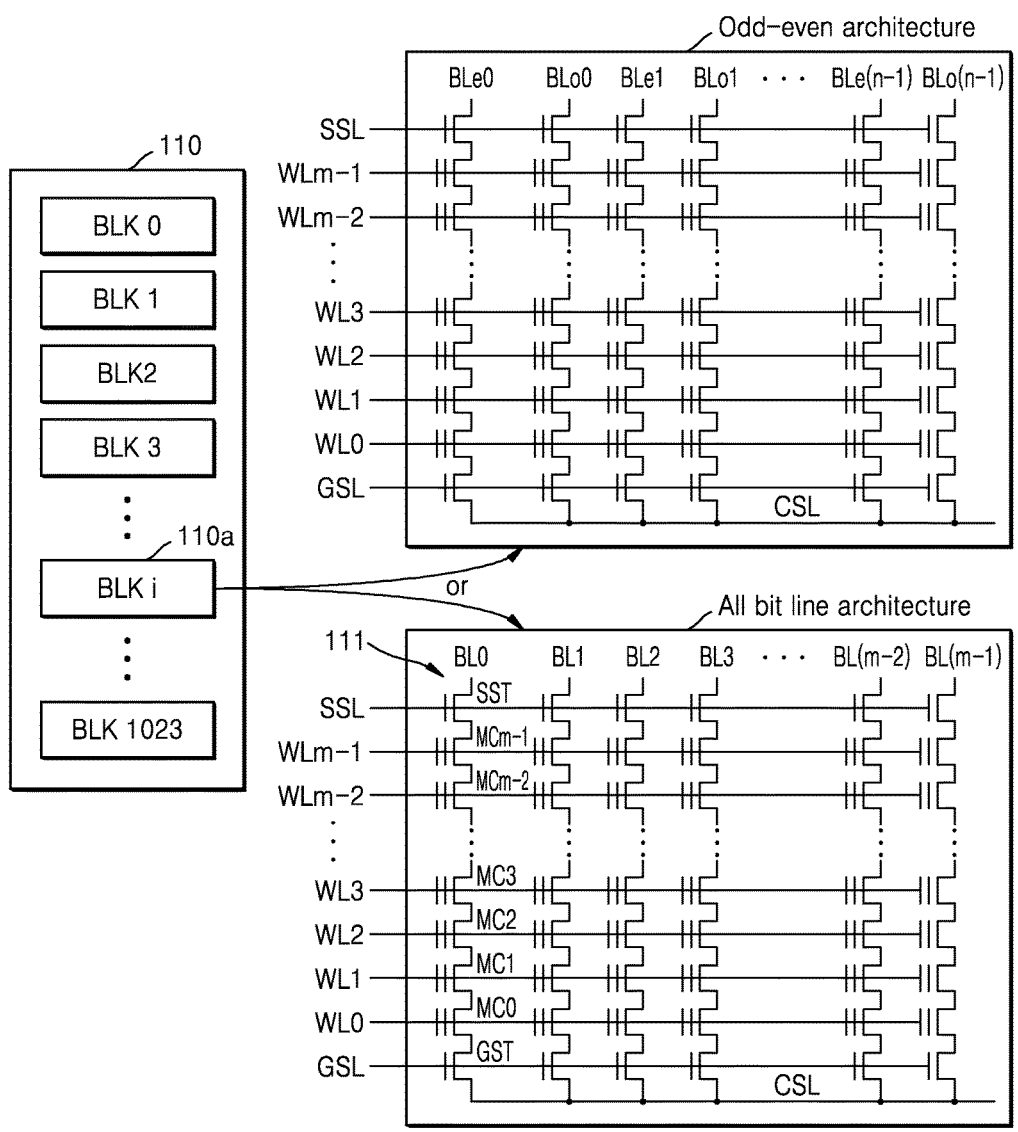
FIG. 3 is a diagram for describing example structures of a memory cell array of FIG. 2.

FIG. 3 is a diagram for describing example structures of the memory cell array of FIG. 2.

Referring to FIG. 3, an NAND flash memory device in which the memory cell array 110 is divided into a plurality (e.g., 1024) of memory blocks BLK0 to BLK1023 is illustrated. Pieces of data stored in the respective memory blocks BLK0 to BLK1023 may be simultaneously erased. The memory block is a minimum unit of memory cells which are simultaneously erased.

Each of the memory blocks BLK0 to BLK1023 has a plurality of columns respectively corresponding to bit lines BLs. In one embodiment referred to as an all bit line (ABL) architecture, ABLs BL0 to BL(m−1) may simultaneously select read and program operations. The memory cells included in a common word line and are connected to the ABLs BL0 to BL(m−1) may be simultaneously programmed.

According to at least one example embodiment of the inventive concepts, a plurality of memory cells MC0 to MCm−1 included in the same column are connected in series to form an NAND string 111. One terminal of the NAND string 111 is connected to a corresponding bit line BL0 through a selection transistor SST controlled by a string selection line SSL, and the other terminal of the NAND string 111 is connected to a common source line CSL through a ground selection transistor GST controlled by a ground selection line GSL.

In another embodiment referred to as an odd-even architecture, bit lines are divided into even bit lines BLes and odd bit lines BLos. In the odd-even architecture, memory cells included in a common word line and are connected to the odd bit lines BLos are programmed at a first time, and conversely, memory cells included in the common word line and are connected to the even bit lines BLe may be programmed at a second time.

Figure 4:
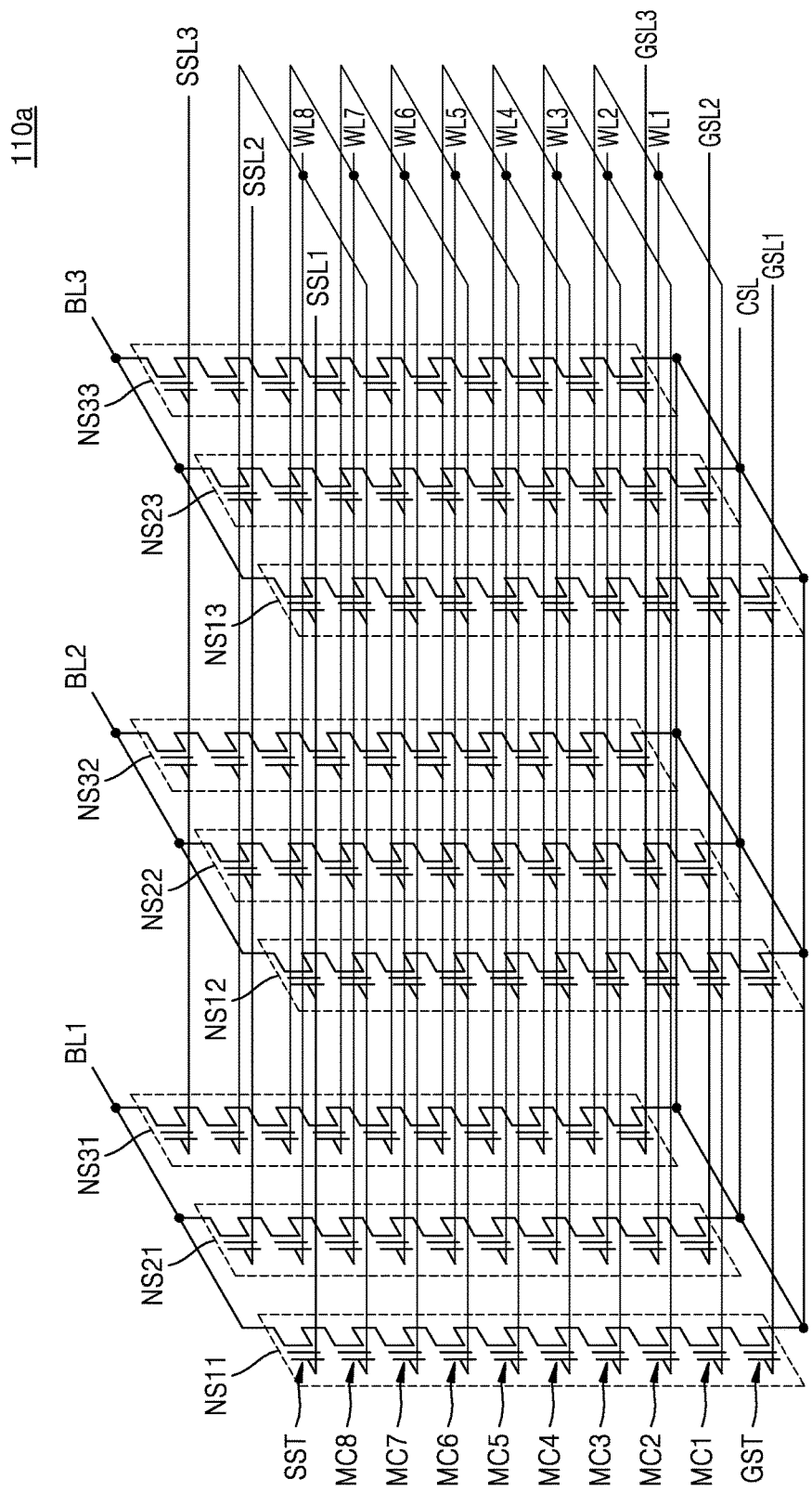
FIG. 4 is a circuit diagram illustrating an example of the memory cell array of FIG. 3.

FIG. 4 is a circuit diagram illustrating an example of the memory cell array of FIG. 3.

Referring to FIG. 4, a portion of a single memory block BLKi of the memory blocks BLK0 to BLK1023 described in FIG. 3 will now be described. According to at least some example embodiments, each of blocks BLK0 to BLK1023 may include the structure illustrated in FIG. 4 and described below.

The memory cell array 110a may include a plurality of memory blocks, and each of the memory blocks may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of the NAND strings, the number of the word lines, the number of the bit lines, the number of the ground selection lines, and the number of the string selection lines may be variously changed according to the embodiment.

NAND strings NS11, NS21, and NS31 are provided between a first bit line BL1 and the common source line CSL, NAND strings NS12, NS22, and NS32 are provided between a second bit line BL2 and the common source line CSL, and NAND strings NS13, NS23, and NS33 are provided between a third bit line BL3 and the common source line CSL. Each NAND string (e.g., NS11) may include a string selection transistor SST, a plurality of memory cells MC1 to MC8, and a ground selection transistor GST, which are connected in series. Hereinafter, the NAND string is referred to as a string for convenience of description.

Strings commonly connected to a single bit line constitute a single column. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

Strings connected to a single string selection line constitute a single row. For example, the strings NS11, NS12, and NS13 connected to a first string selection line SSL1 may correspond to a first row, the strings NS21, NS22, and NS23 connected to a second string selection line SSL2 may correspond to a second row, and the strings NS31, NS32, and NS33 connected to a third string selection line SSL3 may correspond to a third row.

The string selection transistor SST is connected to the corresponding string selection lines SSL1 to SSL3. The plurality of memory cells MC1 to MC8 are connected to the corresponding word lines WL1 to WL8, respectively. The ground selection transistor GST is connected to the corresponding ground selection line GSL1 to GSL3. The string selection transistor SST is connected to the corresponding bit lines BL1 to BL3, and the ground selection transistor GST is connected to the common source line CSL.

In the present embodiment, word lines (e.g., WL1) having the same height are commonly connected to each other, the string selection lines SSL1 to SSL3 are separated from each other, and the ground selection lines GSL1 to GSL3 are also separated from each other. For example, when memory cells included in the strings NS11, NS12, and NS13, which are connected to a first word line WL1 are programmed, the first word line WL1 and the first string selection line SSL1 are selected. However, at least some example embodiments of the inventive concepts are not limited thereto, and in another embodiment, the ground selection lines GSL1 to GSL3 may be commonly connected to each other.

Figure 5:
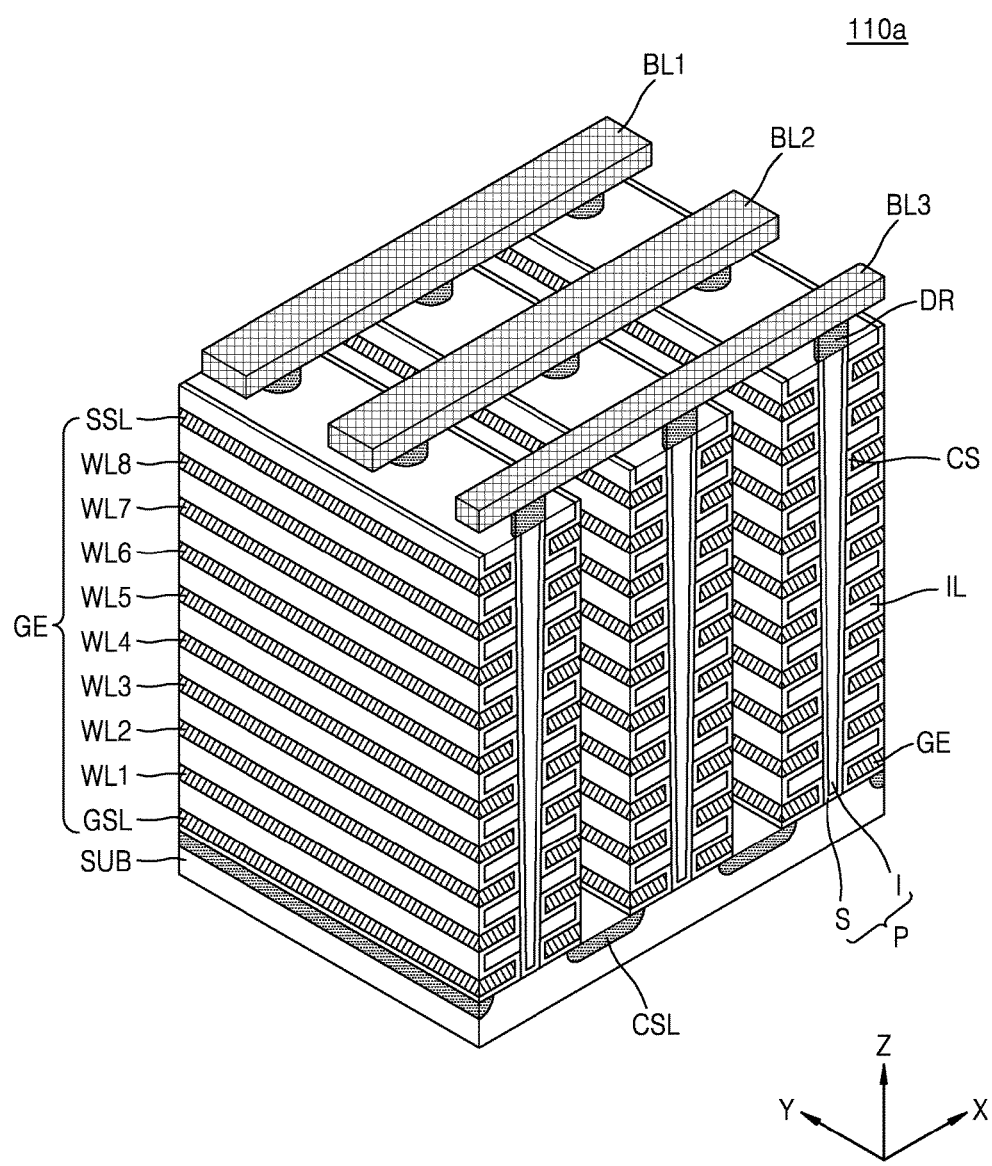
FIG. 5 is a perspective view illustrating the memory cell array of FIG. 4.

FIG. 5 is a perspective view illustrating the memory cell array of FIG. 4.

Referring to FIG. 5, the memory cell array 110a is formed in a direction perpendicular to a substrate SUB. In FIG. 5, although a memory block is illustrated to include two selection lines GSL and SSL, eight word lines WL1 to WL8, and three bit lines BL1 to BL3, the memory block may actually include a number of components more or less than that.

The substrate SUB has a first conductive type (e.g., a P type), and a common source line CSL, which extends along a first direction (e.g., a Y direction), is doped with impurities having a second conductive type (e.g., an N type), and is provided on the substrate SUB. A plurality of insulating layers IL which extend along the first direction are sequentially provided on an area of the substrate SUB between two adjacent common source lines CSLs along a third direction (e.g., a Z direction), and the plurality of insulating layers IL are spaced a desired or, alternatively, predetermined distance from each other along the third direction. For example, the plurality of insulating layers IL may include an insulating material such as silicon oxide.

A plurality of pillars P which are sequentially disposed along the first direction and pass through the plurality of insulating layers IL in the third direction are provided on the area of the substrate SUB between the two adjacent common source lines CSL. For example, the plurality of pillars P may pass through the plurality of insulating layers IL to come into contact with the substrate SUB. Specifically, a surface layer S of each of the pillars P may include a silicon material having a first conductive type and serve as a channel area. Meanwhile, an inner layer I of each of the pillars P may include an insulating material such as silicon oxide or an air gap.

In the area between the two adjacent common source lines CSLs, a charge storage layer CS is provided along exposed surfaces of the insulating layers IL, the pillars P, and the substrate SUB. The charge storage layer CS may include a gate insulating layer (which may be referred to as 'a tunnel insulating layer'), a charge trapping layer, and a blocking insulating layer. For example, the charge storage layer CS may have an oxide-nitride-oxide (ONO) structure. Further, in the area between the two adjacent common source lines CSLs, gate electrodes GE such as the selection lines GSL and SSL and the word lines WL1 to WL8 are provided on an exposed surface of the charge storage layer CS.

Drains or drain contacts DR are respectively provided on the plurality of pillars P. For example, the drains or the drain contacts DR may include a silicon material doped with impurities having the second conductive type. The bit lines BL1 to BL3, which extend in the second direction (e.g., an X direction) and are spaced a desired or, alternatively, predetermined distance from each other along the first direction, are provided on the drain contacts DR.

Figure 7:
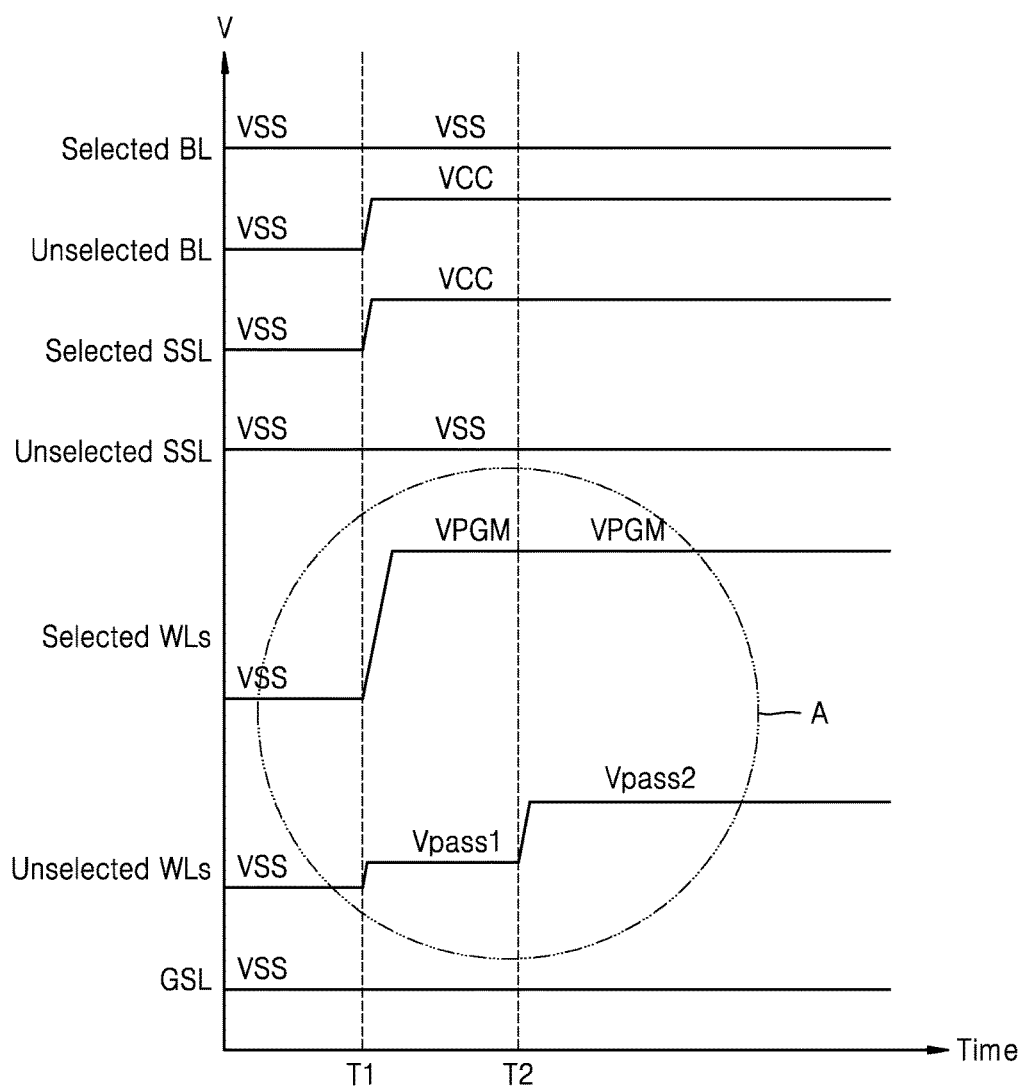
FIG. 7 is a timing diagram illustrating voltage changes in a memory cell array according to the voltage conditions of FIG. 6.

FIG. 6 is a table illustrating voltage conditions applied to the memory cell array 110 of FIG. 3 during a program operation. FIG. 7 is a timing diagram illustrating voltage changes in the memory cell array 110 according to the voltage conditions of FIG. 6.

Referring to FIGS. 3, 6, and 7, at a first time T1, the ground voltage VSS is supplied to the ground selection line GSL, and the ground selection transistor GST is turned off. The power voltage VCC is supplied to a selected string selection line SSL, and the string selection transistor SST is turned on. The ground voltage VSS is supplied to unselected string selection lines SSLs. The ground voltage VSS is supplied to a selected bit line BL and the power voltage VCC is supplied to unselected bit lines BLs. The program voltage VPGM is applied to a selected word line WL of the word lines, and a first pass voltage $V_{pass1}$ is applied to unselected word lines WLs.

At a second time T2, the second pass voltage $V_{pass2}$ higher than the first pass voltage $V_{pass1}$ is applied to the unselected word lines WLs of the word lines. In this case, the voltage of the selected word line WL (to which the program voltage VPGM is applied) may be coupled to the voltages of one or more of the unselected word lines WL (to which the second pass voltage $V_{pass2}$ is applied) by parasitic resistance and capacitance differences between the word lines. Accordingly, the program voltage VPGM of the selected word line WL is increased, for example, as a result of the coupling, and thus a time at which the program voltage VPGM of the selected word line WL reaches a target program voltage level may be shortened. Herein, coupling that occurs, for example, due to parasitic resistance and/or capacitance between word lines, may be referred to interchangeably as coupling between voltages of the word lines and coupling between the word lines, themselves.

Figure 8A:
FIGS. 8A to 8C are diagrams for schematically describing threshold voltage distributions according to the number of data bits stored in a memory cell.
Figure 8B:
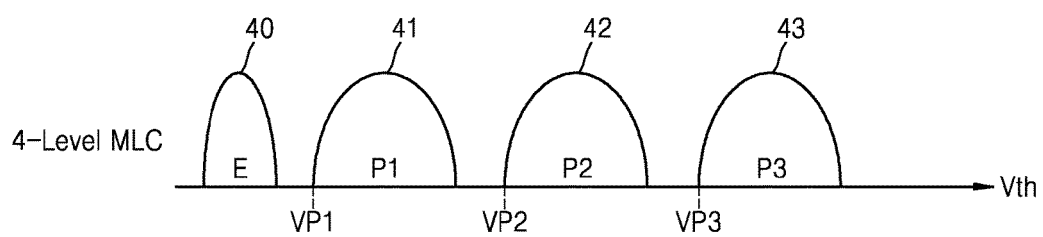
Figure 8C:
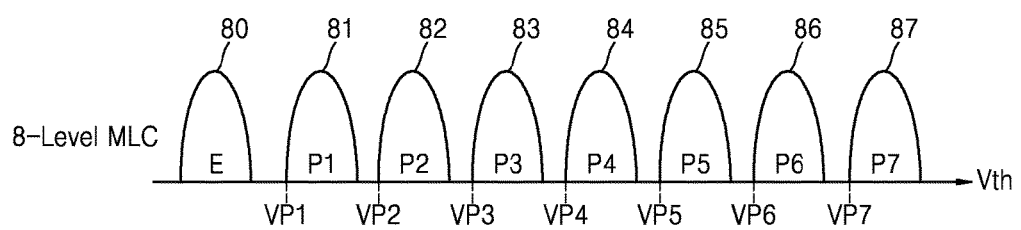

FIGS. 8A to 8C are views for schematically describing threshold voltage distributions according to the number of data bits stored in a memory cell.

When 1-bit data (2-level data/1-page data) is stored in a single memory cell, each of memory cells may have a threshold voltage distribution 20 of a memory cell having an erase state E and a threshold voltage distribution 21 of a memory cell having a first program state P1 as illustrated in FIG. 8A. The threshold voltage distribution 20 may include threshold voltages of erased memory cells, and the other threshold voltage distribution 21 may include threshold voltages of programmed memory cells. A voltage $V_{P1}$ indicates a verification voltage for determining whether or not each of the memory cells is programmed with the threshold voltage distribution 21. After the program operation of FIGS. 6 and 7 is performed, threshold voltages of the memory cells of the selected word line may be distributed as illustrated in FIG. 8A.

When 2-bit data (4-level data/2-page data) is stored in a single memory cell, each of memory cells may have a threshold voltage included in any one of four threshold voltage distributions 40, 41, 42, and 43 as illustrated in FIG. 8B. The threshold voltage distribution 40 may include threshold voltages of erased memory cells, and the other threshold voltage distributions 41 to 43 may include threshold voltages of programmed memory cells. Voltages $V_{P1}$ to $V_{P3}$ indicate verification voltages for determining whether or not each of the memory cells is programmed with each of the threshold voltage distributions 41 to 43. After the 4-level data (2-page data) is programmed in the memory cells of the selected word line, the threshold voltages of the memory cells of the selected word line may be distributed as illustrated in FIG. 8B.

When 3-bit data (8-level data/3-page data) is stored in a single memory cell, each of memory cells may have a threshold voltage included in any one of eight threshold voltage distributions 80 to 87 as illustrated in FIG. 8C. The threshold voltage distribution 80 may include threshold voltages of erased memory cells, and the other threshold voltage distributions 80 to 87 may include threshold voltages of programmed memory cells. Voltages $V_{P1}$ to $V_{P7}$ indicate verification voltages for determining whether or not each of the memory cells is programmed with each of the threshold voltage distributions 80 to 87. After the 8-level data (3-page data) is programmed in the memory cells of the selected word line, the threshold voltages of the memory cells of the selected word line may be distributed as illustrated in FIG. 8C.

Figure 9:
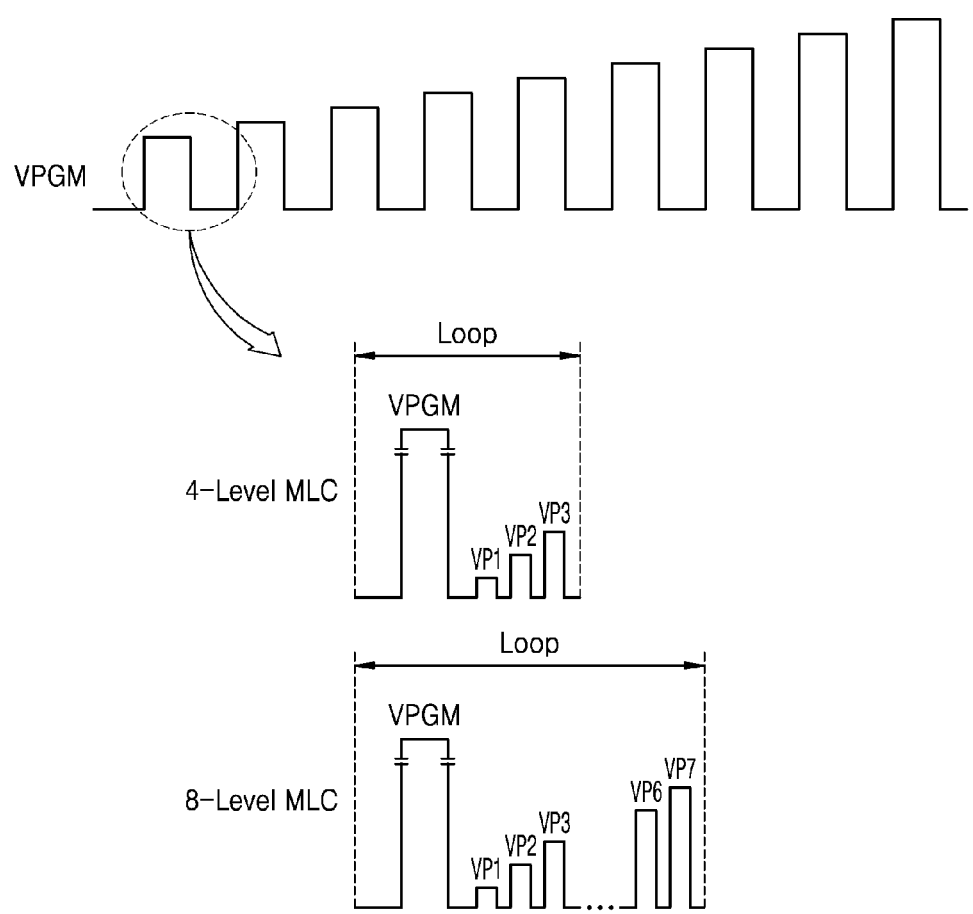
FIG. 9 is a diagram illustrating a series of program pulses for programming memory cells to multi-level data.

FIG. 9 is a view illustrating a series of program pulses for programming memory cells of a selected word line to multi-level data.

Referring to FIG. 9, in a general programming method, the program voltage VPGM is applied to a control gate of a memory cell with a series of program pulses. Sizes of the program pulses are increased with each successive program pulse by a desired or, alternatively, predetermined distance step size. The series of program pulses may be applied in a series of loops, where each loop includes a program pulse followed by a plurality of verification voltages. For example, verification operations (or verification read operations) may be performed between program pulses. In order to determine whether a programming level (i.e., a threshold voltage) of each of the memory cells simultaneously programmed (e.g., the memory cells included in a selected word line) is greater than or the same as a verification level (i.e., a verification voltage), the memory cells are read between successive program pulses.

In order to determine whether or not a multi-level memory cell reaches a verification level related to its data (its data associated verification level), a verification operation may be performed on each state of the memory cell. As illustrated in FIG. 8B, a multi-level memory cell (e.g., a 4-level MLC) capable of storing data with four states/levels may correspond to verification operations that are performed with respect to the three verification voltages $V_{P1}$, $V_{P2}$, and $V_{P3}$. In the same manner, a multi-level memory cell (e.g., an 8-level MLC) capable of storing data with eight states/levels, as illustrated in FIG. 8C, may correspond to verification operations with respect to the seven verification voltages $V_{P1}$ to $V_{P7}$ should.

In a program operation of the 4-level MLC or the eight-level MLC, a program pulse of the program pulses in a single loop corresponds to the program voltage VPGM of the selected word line WL described in FIG. 7. In a portion A of FIG. 7, the voltage of the selected word line WL (to which the program voltage VPGM is applied) may be coupled to the voltages of one or more of the unselected word lines WL (to which the second pass voltage $V_{pass2}$ is applied), and thus may quickly reach a target program voltage level, for example, as a result of the coupling.

The voltage of the selected word line WL (to which the program voltage VPGM is applied) coupled to the voltages of one or more of the unselected word lines WL (to which the second pass voltage $V_{pass2}$ is applied) is influenced by parasitic resistance and capacitance differences between the word lines. A problem in which the program voltage VPGM of the selected word line WL is overshot or a program voltage setup time is lengthened according to the parasitic resistance and capacitance differences may occur.

Figure 10A:
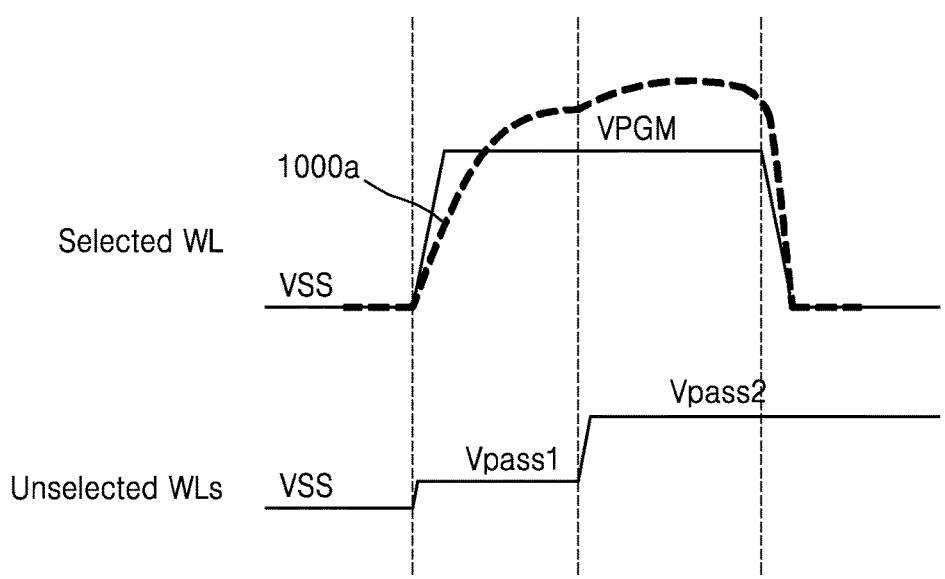
FIGS. 10A and 10B are diagrams illustrating program voltages according to parasitic resistance and capacitance differences between word lines.
Figure 10B:
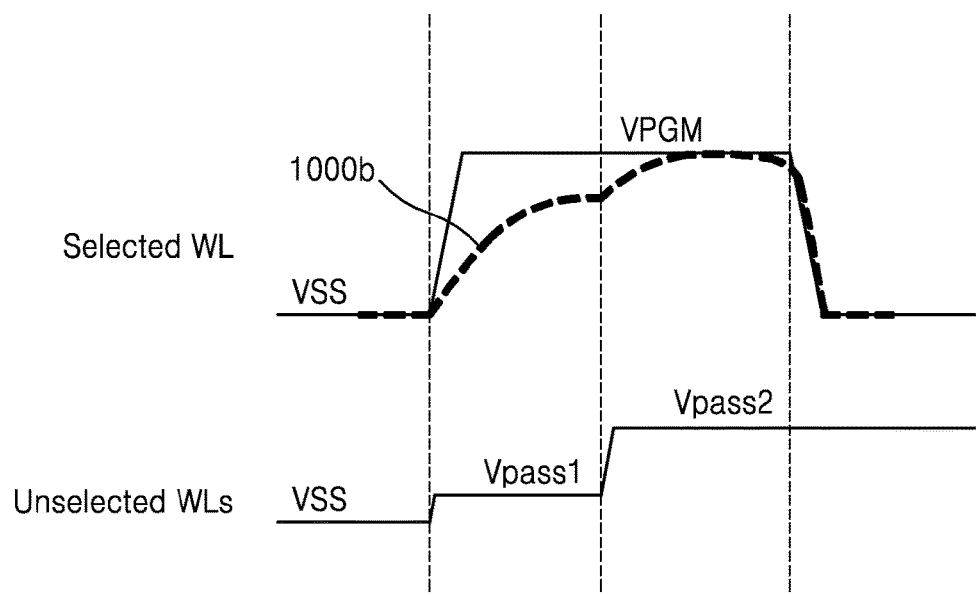

FIGS. 10A and 10B are views illustrating program voltages of a selected word line according to parasitic resistance and capacitance differences between word lines. In FIGS. 10A and 10B, the portion A of FIG. 7 is enlarged and will be described.

When the parasitic resistance and capacitance differences between the word lines are small, a program voltage waveform 1000a in which the program voltage VPGM of a selected word line WL is overshot as a result of coupling to the first and second pass voltages $V_{pass1}$ and $V_{pass2}$ of unselected word lines WLs may be seen as illustrated in FIG. 10A.

When the parasitic resistance and capacitance differences between the word lines are large, a program voltage waveform 1000b in which the program voltage VPGM of a selected word line WL is slightly coupled to the first and second pass voltages $V_{pass1}$ and $V_{pass2}$ of unselected word lines WLs and a program voltage setup time is lengthened may be seen as illustrated in FIG. 10B.

As used herein, the term "voltage setup time" refers to the length of time between a point in time at which a desired voltage (e.g., the program voltage VPGM) is applied to a word line WL (e.g., by the address decoder 120) and a point in time at which a level of a voltage of the word line WL reaches the level of the desired voltage (e.g., the program voltage VPGM).

Figure 11:
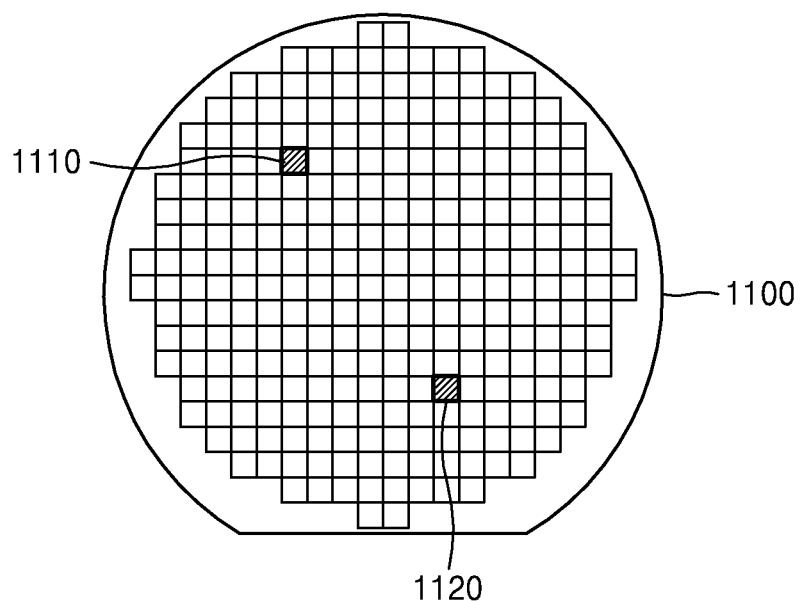
FIG. 11 is a diagram illustrating wafer sites of a flash memory device having types of the program voltages of FIGS. 10A and 10B.

A phenomenon in which a level of a voltage of the selected word line WL overshoots a level of the program voltage VPGM applied to the selected word line LN or the program voltage setup time is lengthened may differ in each flash memory device according to the parasitic resistance and capacitance differences between the word lines. For example, as illustrated in FIG. 11, the phenomenon may differ according to a site of a wafer 1100 in which the flash memory device is manufactured.

In a test of the flash memory device at a first site 1110, the program voltage VPGM applied to the selected word line WL may be overshot due to coupling caused by the first and second pass voltages $V_{pass1}$ and $V_{pass2}$ applied to unselected word lines WLs, and a program voltage setup time of the selected word line WL in the flash memory device at a second site 1120 may be increased.

As used herein, a description of a program voltage VPGM applied to a word line WL as being "overshot" refers to a level of a voltage of a selected word line WL overshooting (e.g., exceeding) a level of the program voltage VPGM applied to the selected word line WL.

On the other hand, the program voltage setup time of the selected word line WL in the flash memory device at the first site 1110 may be increased, or the program voltage VPGM of the selected word line WL in the flash memory device at the second site 1120 may be overshot.

In order to address the problem in which the program voltage VPGM of the selected word line WL is overshot or the program voltage setup time is lengthened, a method of improving program performance by improving the parasitic resistance and capacitance differences using a program voltage VPGM having a discharge interval will be described below in detail.

FIGS. 12 to 19 are views for describing programming methods of non-volatile memory devices according to at least some example embodiments of the inventive concepts.

Before describing the program methods, a program operation may largely include a program execution interval and a verification interval. The program execution interval is an interval for changing threshold voltages of memory cells of a selected word line WL, and the verification interval is an interval for determining whether or not the threshold voltages of the memory cells which are each changed during the program execution interval reach corresponding target voltages (verification voltages). During the program execution interval, as described in FIG. 7, the ground voltage VSS may be supplied to a ground selection line GSL, the power voltage VCC may be supplied to a selected string selection line SSL, the ground voltage VSS may be supplied to unselected string selection lines SSLs, the ground voltage VSS may be supplied to a selected bit line BL, and the power voltage VCC may be supplied to unselected bit lines BLs. Also, the program voltage VPGM and the first and second pass voltages $V_{pass1}$ and $V_{pass2}$ may be applied to a selected word line WL and unselected word lines WLs as illustrated in FIGS. 12 to 19.

Figure 12:
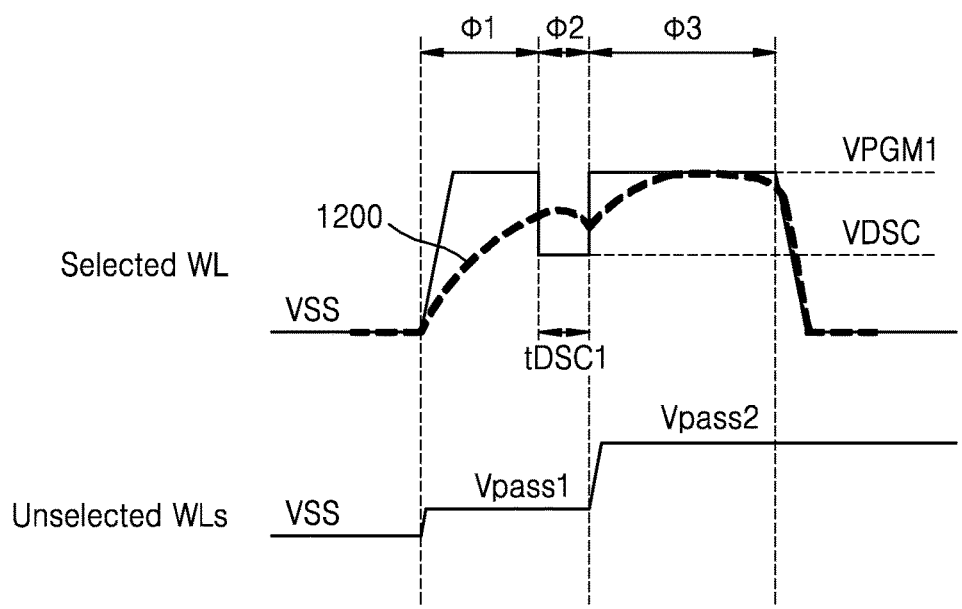
FIGS. 12 to 19 are diagrams for describing programming methods of non-volatile memory devices according to at least some example embodiments of the inventive concepts.

Referring to FIG. 12, in a program operation, a first program voltage VPGM1 having a first discharge interval tDSC1 is applied to the selected word line WL, and the first and second pass voltages $V_{pass1}$ and $V_{pass2}$ are sequentially applied to the unselected word lines WLs.

The selected word line WL is set so that the first program voltage VPGM1 is applied during a first interval Φ1, a discharge voltage $V_{DSC}$ is applied during a second interval Φ2, and the first program voltage VPGM1 is applied during a third interval 43. The discharge voltage $V_{DSC}$ may have a lower voltage level than the first program voltage VPGM1, and the second interval Φ2 in which the discharge voltage $V_{DSC}$ is applied may be referred to as the first discharge interval tDSC1.

The unselected word lines WLs are set so that the first pass voltage $V_{pass1}$ is applied during the first and second intervals Φ1 and Φ2 and the second pass voltage $V_{pass2}$ is applied during the third interval Φ3. The second pass voltage $V_{pass2}$ has a higher voltage level than the first pass voltage $V_{pass1}$.

The voltage of the selected word line WL (to which the program voltage VPGM is applied) may be coupled to the voltages of one or more of the unselected word lines WL (to which the second pass voltage $V_{pass2}$ is applied), and thus the voltage of the selected word line WL may have a first selected word line voltage waveform 1200. Also, the first selected word line waveform 1200 may be influenced by a resistance and the capacitance of the selected word line WL itself and the parasitic resistance and capacitance differences between the word lines.

When the first program voltage VPGM1 applied to the selected word line WL does not have the first discharge interval tDSC1, the first program voltage VPGM1 may be predicted to be overshot as illustrated in FIG. 10A. The first program voltage VPGM1 in the first discharge interval tDSC1 may be prevented from being overshot even when the selected word line WL is coupled to one or more of the unselected word lines WLs to which the second pass voltage $V_{pass2}$ is applied.

Figure 13:
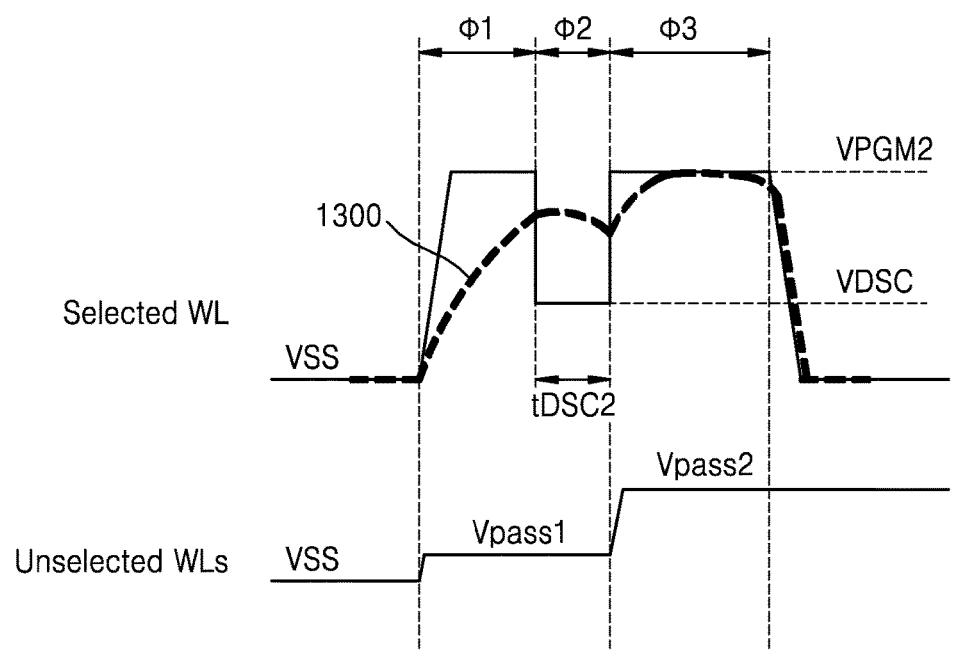

Referring to FIG. 13, in a program operation, when program pulses have different voltage levels according to a program loop as illustrated in FIG. 9, a second program voltage VPGM2 having a second discharge interval tDSC2 is applied to the selected word line WL, and the first and second pass voltages $V_{pass1}$ and $V_{pass2}$ are sequentially applied to the unselected word lines WLs.

Compared with FIG. 12, there is a difference in that the second program voltage VPGM2 having the second discharge interval tDSC2 greater than the first discharge interval tDSC1 is applied to the selected word line WL and the second program voltage VPGM2 is applied to be higher than the first program voltage VPGM1. The second discharge interval tDSC2 is set to be large in order to prevent the second program voltage VPGM2 from being overshot even when the selected word line WL is coupled to one or more of the unselected word lines WLs wo which the second pass voltage $V_{pass2}$ are applied. The selected word line WL may be sufficiently discharged during the second discharge interval tDSC2 and a voltage of the selected word line WL may have a second selected word line waveform 1300.

The selected word line WL is set so that the second program voltage VPGM2 is applied during a first interval Φ1, the discharge voltage $V_{DSC}$ is applied during a second interval Φ2 (the second discharge interval tDSC2), and the second program voltage VPGM2 is applied during a third interval Φ3. The second program voltage VPGM2 of the selected word line WL may be prevented from being overshot by using the second discharge interval tDSC2 even when the selected word line WL is coupled to one or more of the unselected word lines WLs to which the second pass voltage $V_{pass2}$ is applied.

In the programming methods of FIGS. 12 and 13, the discharge intervals tDSC1 and tDSC2 are set differently according to levels of the program voltages VPGM1 and VPGM2 of the selected word line WL, and thus the program voltages VPGM1 and VPGM2 may be prevented from being overshot.

From another point of view, the programming methods of FIGS. 12 and 13 may be used to address a problem in which a program voltage setup time of the selected word line is lengthened. For example, the program voltage setup time of the selected word line may be reduced by using the first program voltage VPGM1 having the first discharge interval tDSC1 of FIG. 12. Since the first discharge interval tDSC1 of FIG. 12 is smaller than the second discharge interval tDSC2 of FIG. 13, a reduction in the level of the voltage of the selected word line WL due to the first discharge interval tDSC1 may be predicted to be small. Accordingly, the voltage of the selected word line WL is coupled to voltages of one or more of the unselected word lines to which the second pass voltage $V_{pass2}$ is applied, and thus, as a result of the coupling, may rise quickly to the level of the first program voltage VPGM1.

Figure 14:
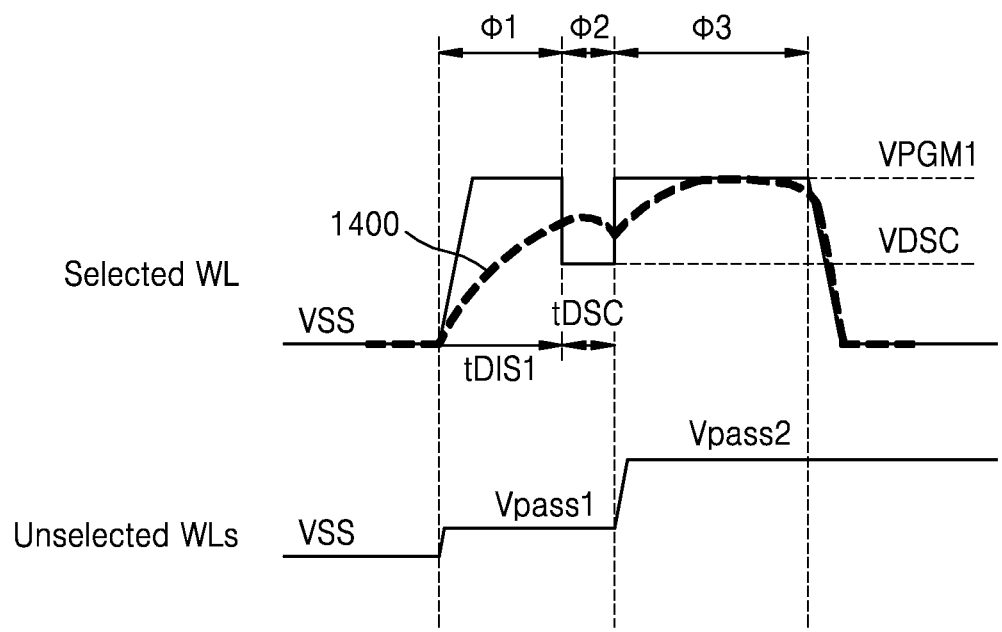

Referring to FIG. 14, in a program operation, a first program voltage VPGM1 having a discharge interval tDSC at a first discharge start time tDIS1 is applied to the selected word line WL, and the first and second pass voltages $V_{pass1}$ and $V_{pass2}$ are applied to the unselected word lines WLs.

The selected word line WL is set so that the first program voltage VPGM1 is applied during a first interval Φ1, a discharge voltage $V_{DSC}$ is applied during a second interval Φ2, and the first program voltage VPGM1 is applied during a third interval Φ3. The discharge voltage $V_{DSC}$ has a lower voltage level than the first program voltage VPGM1. As is illustrated in FIG. 14, a time point at which the discharge voltage $V_{DSC}$ is applied is set to a time at which the first discharge start time tDIS1 has elapsed while the first program voltage VPGM1 is being applied. The first discharge start time tDIS1 may be seen to be the same as the first interval Φ1. The second interval 42 may be seen as the discharge interval tDSC.

The unselected word lines WLs are set so that the first pass voltage $V_{pass1}$ is applied to the unselected word lines WLs during the first and second intervals Φ1 and Φ2 and the second pass voltage $V_{pass2}$ is applied to the unselected word lines WLs during the third interval Φ3. The second pass voltage $V_{pass2}$ has a higher voltage level than the first pass voltage $V_{pass1}$.

According to at least some example embodiments of the inventive concepts, a voltage of the selected word line WL is discharged after the first discharge start time tDIS1 and may have a first selected word line WL voltage waveform 1400, so as to prevent the first program voltage VPGM1 from being overshot even when the selected word line WL is coupled to one or more of the unselected word lines WLs (to which the second pass voltage $V_{pass2}$ is applied) at the third interval Φ3 by discharging the voltage of the selected word line WL at the first discharge start time tDIS1 during the discharge interval tDSC.

Figure 15:
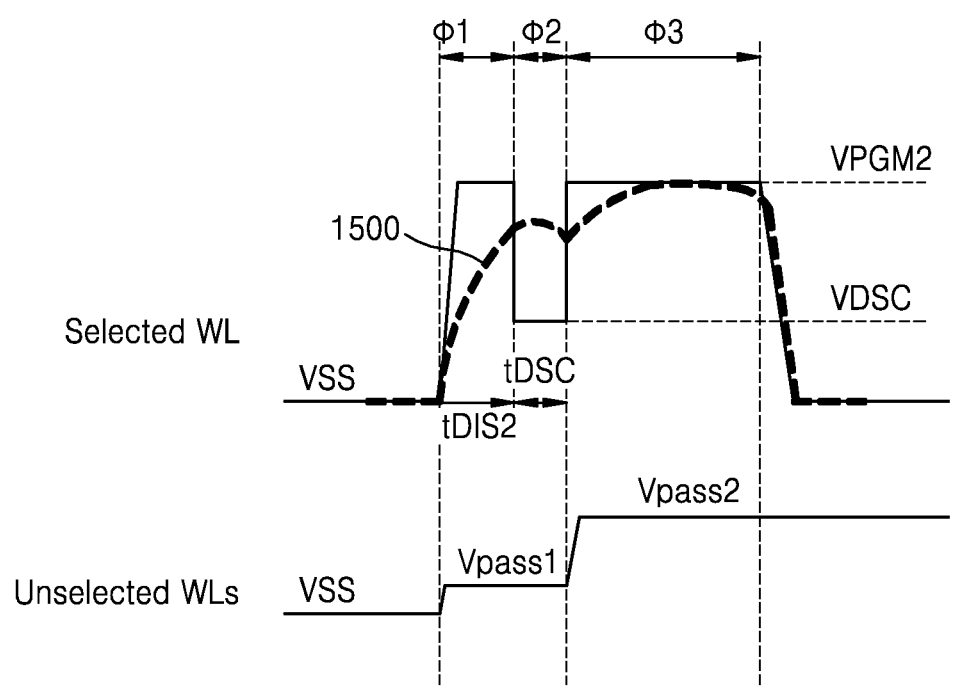

Referring to FIG. 15, in a program operation, a second program voltage VPGM2 having a discharge interval tDSC at a second discharge start time tDIS2 is applied to the selected word line WL, and the first and second pass voltages $V_{pass1}$ and $V_{pass2}$ are applied to the unselected word lines WLs.

Compared with FIG. 14, there is a difference in that the second program voltage VPGM2 having the second discharge start time tDIS2 smaller than the first discharge start time tDIS1 is applied to the selected word line WL and the second program voltage VPGM2 is applied to be higher than the first program voltage VPGM1. The second discharge start time tDIS2 is set to be small in order to prevent the second program voltage VPGM2 from being overshot even when the selected word line WL is coupled to one or more of the unselected word lines WLs (to which the second pass voltage $V_{pass2}$ is applied). Since the voltage of the selected word line WL having a high voltage level is discharged during the discharge interval tDSC starting from the second discharge start time tDIS2, the voltage of the selected word line WL may be sufficiently discharged and may have a second selected word line WL voltage waveform 1500.

The selected word line WL is set so that the second program voltage VPGM2 is applied during a first interval Φ1 (the second discharge start time tDIS2), a discharge voltage $V_{DSC}$ is applied during a second interval Φ2 (the discharge interval tDSC), and the second program voltage VPGM2 is applied during a third interval Φ3. The second program voltage VPGM2 of the selected word line WL may be prevented from being overshot by using the discharge interval tDSC at the second discharge start time tDIS2 even when the selected word line WL is coupled to one or more of the unselected word lines WLs (to which the second pass voltage $V_{pass2}$ is applied).

In the programming methods of FIGS. 14 and 15, the discharge start times tDIS1 and tDIS2 are set differently according to levels of the program voltages VPGM1 and VPGM2 of the selected word line WL, and thus the program voltages VPGM1 and VPGM2 may be prevented from being overshot.

From another point of view, the programming methods of FIGS. 14 and 15 may be used to address a problem in which a program voltage setup time of the selected word line WL is lengthened. For example, the program voltage setup time of the selected word line WL may be reduced by using the first program voltage VPGM1 having the discharge interval tDSC at the first discharge start time tDIS1 of FIG. 14. Since the first discharge start time tDIS1 of FIG. 14 is later than the second discharge start time tDIS2, a reduction in the level of the voltage of the selected word line WL due to the discharge interval tDSC at the first discharge start time tDIS1 may be predicted to be small. Accordingly, due to coupling between the voltage of the selected word line WL and the voltages of one or more of the unselected word lines WL (to which the second pass voltage $V_{pass2}$ is applied), the voltage of the selected word line WL may rise quickly to the level of the first program voltage VPGM1.

Figure 16:
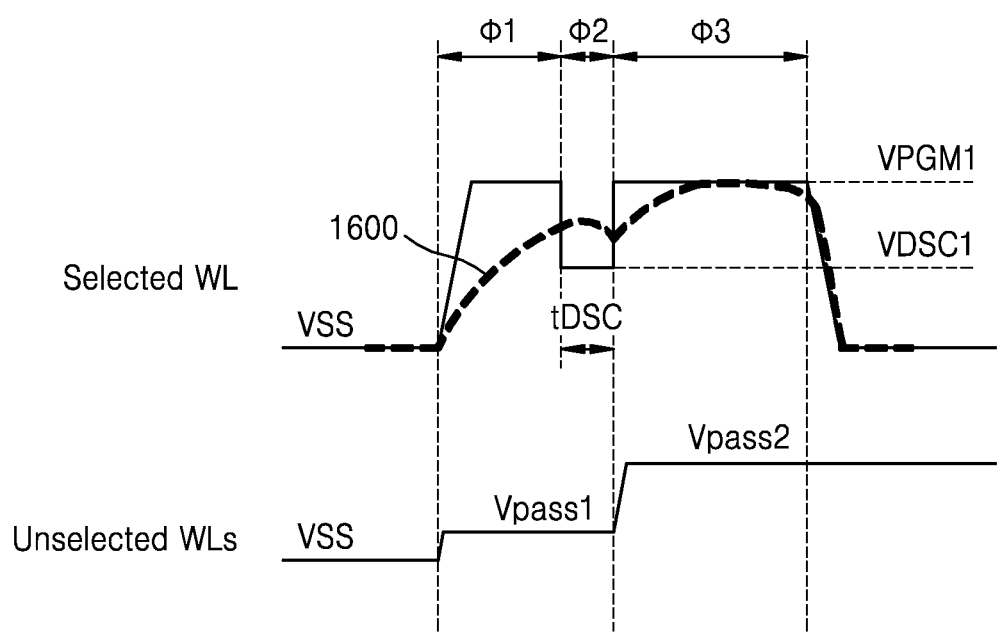

Referring to FIG. 16, in a program operation, a first program voltage VPGM1 having a discharge interval tDSC of a first discharge voltage $V_{DSC1}$ is applied to the selected word line WL, and the first and second pass voltages $V_{pass1}$ and $V_{pass2}$ are applied to the unselected word lines WLs.

The selected word line WL is set so that the first program voltage VPGM1 is applied during a first interval Φ1, the first discharge voltage $V_{DSC1}$ is applied during a second interval Φ2, and the first program voltage VPGM1 is applied during a third interval Φ3. The first discharge voltage $V_{DSC1}$ has a lower voltage level than the first program voltage VPGM1. The second interval Φ2 in which the first discharge voltage $V_{DSC1}$ is applied may be referred to as the discharge interval tDSC.

The unselected word lines WLs are set so that the first pass voltage $V_{pass1}$ is applied during the first and second intervals Φ1 and Φ2, and the second pass voltage $V_{pass2}$ is applied during the third interval Φ3. The second pass voltage $V_{pass2}$ has a higher voltage level than the first pass voltage $V_{pass1}$.

According to at least some example embodiments of the inventive concepts, the first program voltage VPGM1 of the selected word line WL is discharged as the first discharge voltage $V_{DSC1}$ during the discharge interval tDSC like a first program voltage waveform 1600. The voltage of the selected word line WL may be discharged by the first discharge voltage $V_{DSC1}$ during the discharge interval tDSC, may be coupled to the voltages of one or more of the unselected word lines WL (to which the second pass voltage $V_{pass2}$ is applied) in the third interval Φ3, and thus may be setup as (i.e., quickly increased to) the level of the first program voltage VPGM1.

Figure 17:
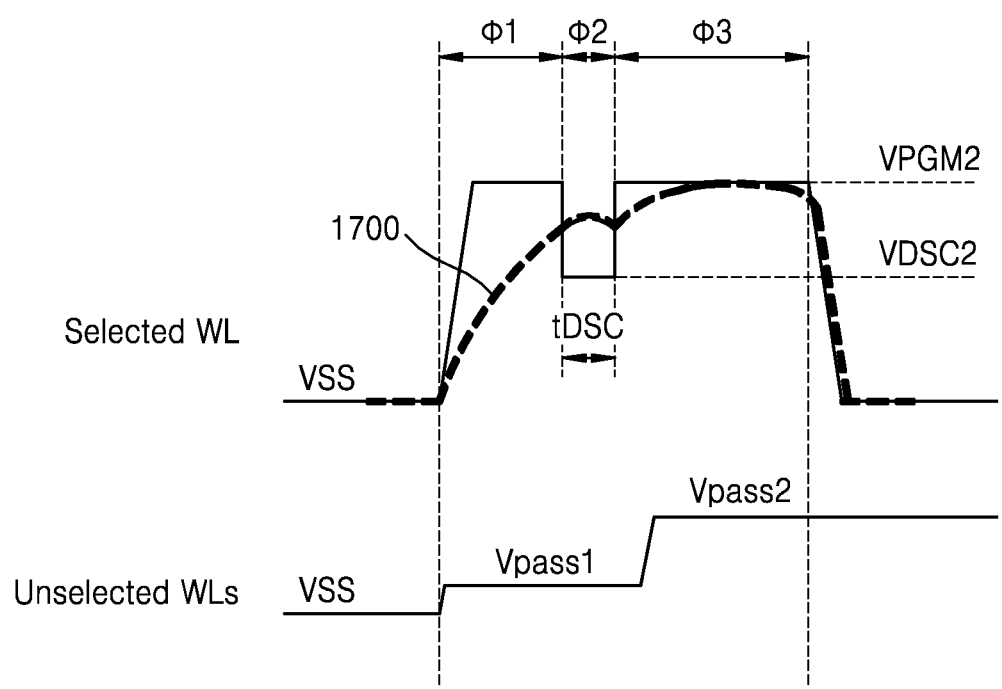

Referring to FIG. 17, in a program operation, a second program voltage VPGM2 having a discharge interval tDSC of a second discharge voltage $V_{DSC2}$ is applied to the selected word line WL, and the first and second pass voltages $V_{pass1}$ and $V_{pass2}$ are applied to the unselected word lines WLs.

Compared with FIG. 16, there is a difference in that the second program voltage VPGM2 having the second discharge voltage $V_{DSC2}$ higher than the first discharge voltage $V_{DSC1}$ is applied to the selected word line WL, and the second program voltage VPGM2 is applied higher than the first program voltage VPGM1. The voltage of the selected word line WL may be discharged as the second discharge voltage $V_{DSC2}$ during the discharge interval tDSC and may have a second program voltage waveform 1700.

It may be seen that the second program voltage waveform 1700 has a smaller degree of discharge than the first program voltage waveform 1600 of FIG. 16, so as to cause a voltage of the selected word line WL to be quickly setup as (i.e., quickly increased to) a level of the second program voltage VPGM2 due to coupling between the voltage of the selected word line WL and the voltages of the unselected word lines WL (to which the second pass voltage $V_{pass2}$ is applied).

The selected word line WL is set so that the second program voltage VPGM2 is applied during a first interval Φ1, the second discharge voltage $V_{DSC2}$ is applied during a second interval Φ2 (a discharge interval tDSC), and the second program voltage VPGM2 is applied during a third interval Φ3. The voltage of the selected word line WL is slightly discharged due to the second discharge voltage $V_{DSC2}$ during the discharge interval tDSC, and thus may be quickly setup as (i.e., quickly increased to) a level of the second program voltage VPGM2 due to being coupled to the voltages of one or more of the unselected word lines WL (to which the second pass voltage $V_{pass2}$ is applied).

In the programming methods of FIGS. 16 and 17, levels of the discharge voltages $V_{DSC1}$ and $V_{DSC2}$ are set differently according to levels of the program voltages VPGM1 and VPGM2 of the selected word line WL, and thus the program voltages VPGM1 and VPGM2 may be quickly setup as the target program voltage level.

From another point of view, the programming methods of FIGS. 16 and 17 may be used to address a problem in which the program voltage of the selected word line is overshot. For example, the program voltage of the selected word line may be prevented from being overshot by using the first program voltage VPGM1 having the first discharge voltage $V_{DSC1}$ of FIG. 16. Since the first discharge voltage $V_{DSC1}$ of FIG. 16 is lower than the second discharge voltage $V_{DSC2}$ of FIG. 17, a level discharged at the first program voltage VPGM1 during the discharge interval tDSC may be predicted to be large. Accordingly, the first program voltage VPGM1 of the selected word line may be prevented from being overshot even when the selected word line WL is coupled to the unselected word lines WLs (to which the second pass voltage $V_{pass2}$ is applied).

Figure 18:
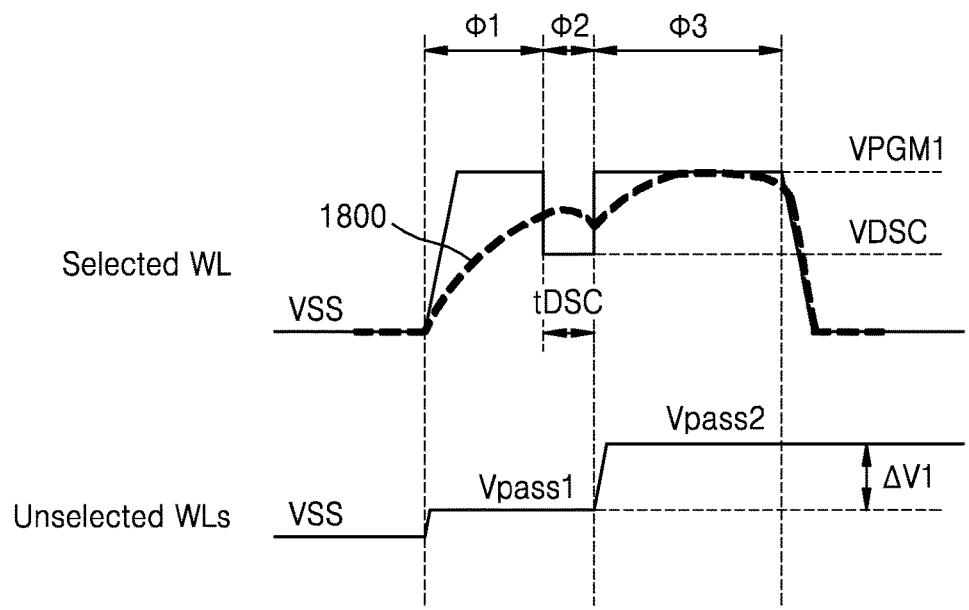

Referring to FIG. 18, in a program operation, a first program voltage VPGM1 having a discharge interval tDSC is applied to the selected word line WL, and the first and second pass voltages $V_{pass1}$ and $V_{pass2}$ are applied to the unselected word lines WLs.

The selected word line WL is set so that the first program voltage VPGM1 is applied during a first interval Φ1, a discharge voltage $V_{DSC}$ is applied during a second interval Φ2, and the first program voltage VPGM1 is applied during a third interval Φ3. The discharge voltage $V_{DSC}$ has a lower voltage level than the first program voltage VPGM1. The second interval Φ2 in which the discharge voltage $V_{DSC}$ is applied may be seen as the discharge interval tDSC.

The unselected word lines WLs are set so that the first pass voltage $V_{pass1}$ is applied during the first and second intervals Φ1 and Φ2, and the second pass voltage $V_{pass2}$ is applied during the third interval Φ3. The second pass voltage $V_{pass2}$ has a higher voltage level than the first pass voltage $V_{pass1}$.

The voltage of the selected word line WL may be discharged by the discharge voltage $V_{DSC}$ during the discharge interval tDSC, may be coupled to the voltages of one or more of the unselected word lines WL (to which the second pass voltage $V_{pass2}$ is applied) in the third interval Φ3, and thus may be setup as (i.e., increased to) a level of the first program voltage VPGM1 as is illustrated by first word line WL voltage waveform 1800.

Figure 19:
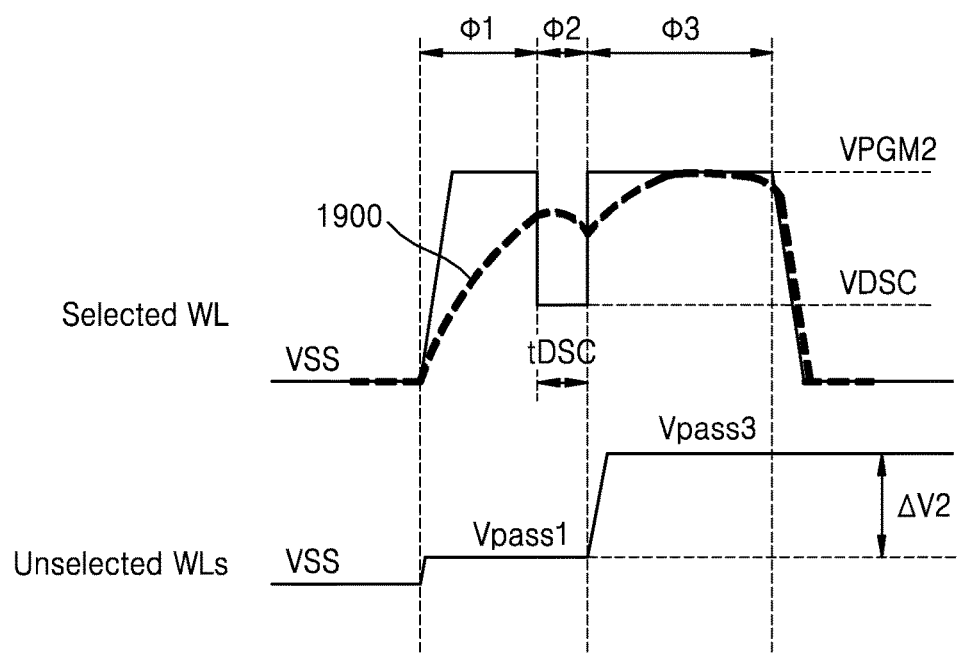

Referring to FIG. 19, in a program operation, a second program voltage VPGM2 having a discharge interval tDSC is applied to the selected word line WL, and first and third pass voltages $V_{pass1}$ and $V_{pass2}$ are applied to unselected word lines WLs.

Compared with FIG. 16, there is a difference in that a third pass voltage $V_{pass3}$ higher than the second pass voltage $V_{pass2}$ is applied to the unselected word lines WLs, and the second program voltage VPGM2 of the selected word line WL is applied to be higher than the first program voltage VPGM1. The second program voltage VPGM2 may be discharged during the discharge interval tDSC, may be coupled to the second pass voltage $V_{pass2}$ of the unselected word lines WLs, and thus may be setup as a target program voltage level like a second program voltage waveform 1900.

According to at least some example embodiments of the inventive concepts, the second program voltage waveform 1900 may have a greater degree of discharge than the first program voltage waveform 1800 of FIG. 18. The voltage of the selected word line WL having the first program voltage waveform 1800 of FIG. 18 is coupled to voltages of one or more of the unselected word lines WLs to which the second pass voltage $V_{pass2}$ is applied, and the voltage of the selected word line WL having the second program voltage waveform 1900 is coupled to voltages of one or more of the unselected word lines WLs to which the third pass voltage $V_{pass3}$ is applied. A first voltage difference ΔV1 exists between the first pass voltage $V_{pass1}$ and the second pass voltage $V_{pass2}$, and a second voltage difference ΔV2 exists between the first pass voltage $V_{pass1}$ and the third pass voltage $V_{pass3}$. Since the second voltage difference ΔV2 is greater than the first voltage difference ΔV1, the second program voltage waveform 1900 may be quickly setup as (i.e., quickly increased to) a level of the second program voltage VPGM2.

In the programming methods of FIGS. 18 and 19, levels of the pass voltages $V_{pass1}$, $V_{pass2}$, and $V_{pass3}$ of the unselected word lines WLs are set differently according to levels of the program voltages VPGM1 and VPGM2 of the selected word line WL, and thus the program voltages VPGM1 and VPGM2 may be quickly setup as the target program voltage level.

From another point of view, the programming methods of FIGS. 18 and 19 may be used to address a problem in which the program voltage of the selected word line is overshot. For example, the program voltage of the selected word line may be prevented from being overshot by using the coupling by the first voltage difference ΔV1 between the first pass voltage $V_{pass1}$ and the second pass voltage $V_{pass2}$ of the unselected word lines WLs of FIG. 18. Since the first voltage difference ΔV1 of FIG. 18 is smaller than the second voltage difference ΔV2 of FIG. 19, a degree of coupling to the first program voltage VPGM1 may be predicted to be small. Accordingly, the first program voltage VPGM1 of the selected word line may be prevented from being overshot even when the selected word line WL is coupled to the unselected word lines WLs (to which the second pass voltage $V_{pass2}$ is applied).

Figure 20:
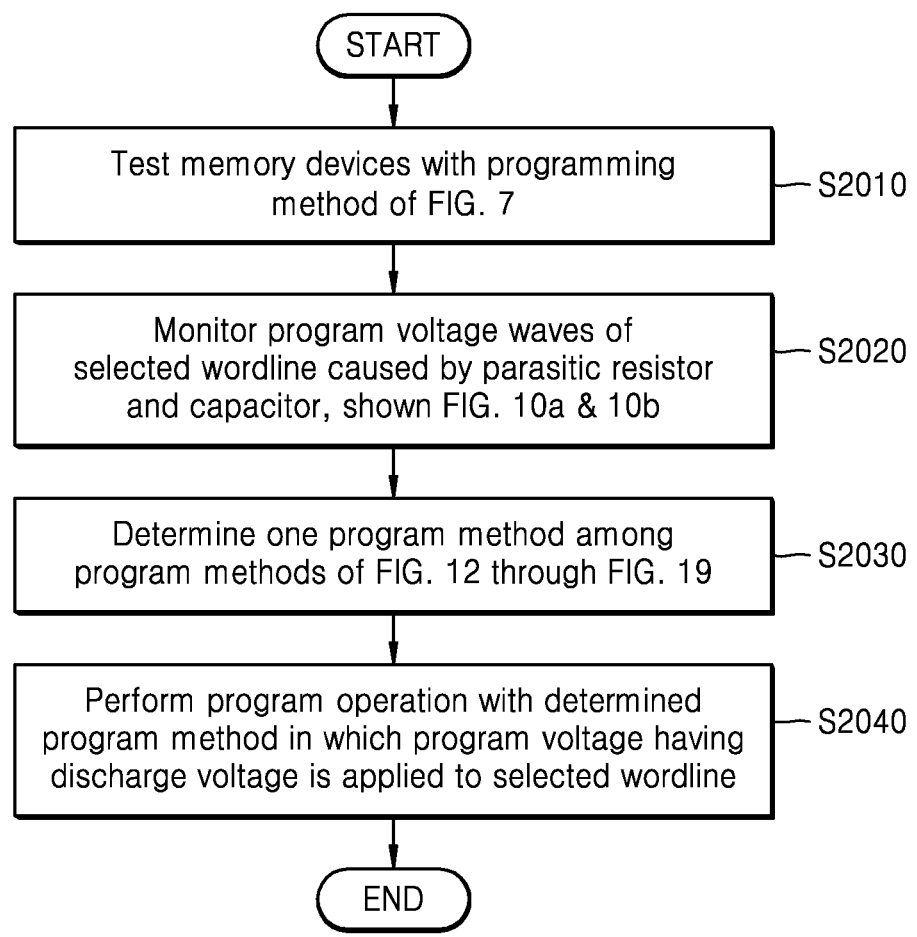
FIG. 20 is a diagram for describing an operating method of a non-volatile memory device according to at least one example embodiment of the inventive concepts.

FIG. 20 is a diagram for describing an operating method of a non-volatile memory device according to at least one example embodiment of the inventive concepts. The operating method of a non-volatile memory device according to at least one example embodiment of the inventive concepts, which is a method performed on a non-volatile memory device in time series, may include, for example, operations performed on the non-volatile memory device 100 of FIG. 2 in time series. Content described with reference to FIGS. 1 to 19 may also be applied to the method illustrated in FIG. 20, and the description thereof will not be repeated.

In S2010, the non-volatile memory device 100 is tested using the programming method of FIG. 7. In S2010, the ground voltage VSS may be supplied to a ground selection line GSL, the power voltage VCC may be supplied to a selected string selection line SSL, the ground voltage VSS may be supplied to unselected string selection lines SSLs, the ground voltage VSS may be supplied to a selected bit line BL, the power voltage VCC may be supplied to unselected bit lines BLs, the program voltage VPGM may be applied to selected word line WL, and the first and second pass voltages $V_{pass1}$ and $V_{pass2}$ may be applied to unselected word lines WLs.

In S2020, a program voltage waveform of the selected word line is monitored while the non-volatile memory device 100 is tested. In S2020, whether or not the program voltage waveform of the selected word line overshoots a program voltage applied to the selected word line due to parasitic resistance and/or capacitance differences between the word lines as illustrated in FIG. 10A, or whether or not a program voltage setup time is lengthened as illustrated in FIG. 10B may be monitored.

In S2030, as a test result of the non-volatile memory device 100, a programming method is determined according to a type of the program voltage waveform. For example, in S2030, like the programming methods of FIGS. 12 and 13, a programming method may be determined in which program voltages VPGM1 and VPGM2 having different discharge intervals tDSC1 and tDSC2 are applied as program voltages of the selected word line.

In S2030, like the programming methods of FIGS. 14 and 15, a programming method may be determined in which program voltages VPGM1 and VPGM2 having different discharge start times tDIS1 and tDIS2 are applied as program voltages of the selected word line.

In S2030, like the programming methods of FIGS. 16 and 17, a programming method may be determined in which program voltages VPGM1 and VPGM2 having different levels of discharge voltages $V_{DSC1}$ and $V_{DSC2}$ are applied as program voltages of the selected word line.

In S2030, like the programming methods of FIGS. 18 and 19, a programming method may be determined in which pass voltages $V_{pass1}$, $V_{pass2}$, and $V_{pass3}$ having different levels are applied to unselected word lines according to the levels of program voltages VPGM1 and VPGM2 applied to the selected word line. In S2030, one of the programming methods of FIGS. 12 to 19 may be determined based on the test result of the non-volatile memory device 100.

In S2040, a program operation may be performed according to the programming method determined based on the test result of the non-volatile memory device 100. In S2040, the program voltages VPGM1 and VPGM2 having the discharge intervals tDSC, tDSC1, and tDSC2 are applied to the selected word line, and thus the program voltages VPGM1 and VPGM2 may be prevented from being overshot even when the selected word line WL is coupled to the unselected word lines WLs (to which the first, second and third pass voltages $V_{pass1}$, $V_{pass2}$, and $V_{pass3}$ are applied) or may be quickly setup (i.e., quickly increased to) a level of a target program voltage level.

Figure 21:
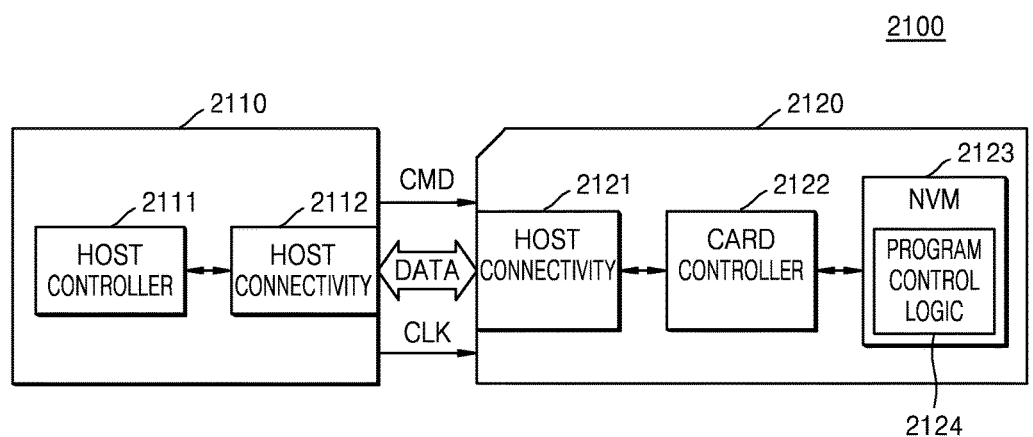
FIG. 21 is a block diagram illustrating an example in which non-volatile memory devices according to at least some example embodiments of the inventive concepts are applied to a memory card system.

FIG. 21 is a block diagram illustrating an example in which the non-volatile memory devices according to at least some example embodiments of the inventive concepts are applied to a memory card system.

Referring to FIG. 21, a memory card system 2100 may include a host 2110 and a memory card 2120. The host 2110 may include a host controller 2111 and a host connector 2112. The memory card 2120 may include a card connector 2121, a card controller 2122, and a non-volatile memory device 2123.

The non-volatile memory device 2123 of the memory card 2120 may be implemented using the embodiments illustrated in FIGS. 1 to 20. The non-volatile memory device 2123 includes a program control logic 2124 which controls so that a first pass voltage is applied to unselected word lines of word lines during a first interval, a second pass voltage higher than the first pass voltage is applied thereto during a second interval, a discharge voltage lower than a program voltage is applied to a selected word line of the word lines during the first interval after the program voltage is applied thereto, and the program voltage is applied thereto during the second interval, in a program operation. The program control logic 2124 may adjust the discharge voltage and/or the second pass voltage based on a level of the program voltage and a coupling rate between the selected word line and the unselected word lines.

The memory card 2120 may be formed to communicate with the host 2110 through at least one of various interface protocols such as USB, MMC, PCI-E, ATA, SATA, PATA, SCSI, ESDI, Integrated Drive Electronics (IDE), and the like.

The host 2110 may store data DATA in the memory card 2120 or read the data DATA stored in the memory card 2120. The host controller 2111 may transmit a command CMD, a clock signal CLK generated from a clock generator in the host 2110, and the data DATA to the memory card 2120 through the host connector 2112.

The card controller 2122 may provide the data DATA to the non-volatile memory device 2123 by synchronizing the command CMD with the clock signal CLK generated from the clock generator in the card controller 2122 in response to the command CMD received through the card connector 2121. The non-volatile memory device 2123 may store the data DATA transmitted from the host 2110.

The memory card 2120 may be implemented as a compact flash card (CFC), a Microdrive, a smart media card (SMC), an MMC, a secure digital card (SDC), a UFS, a memory stick, a USB flash memory driver, and the like.

Figure 22:
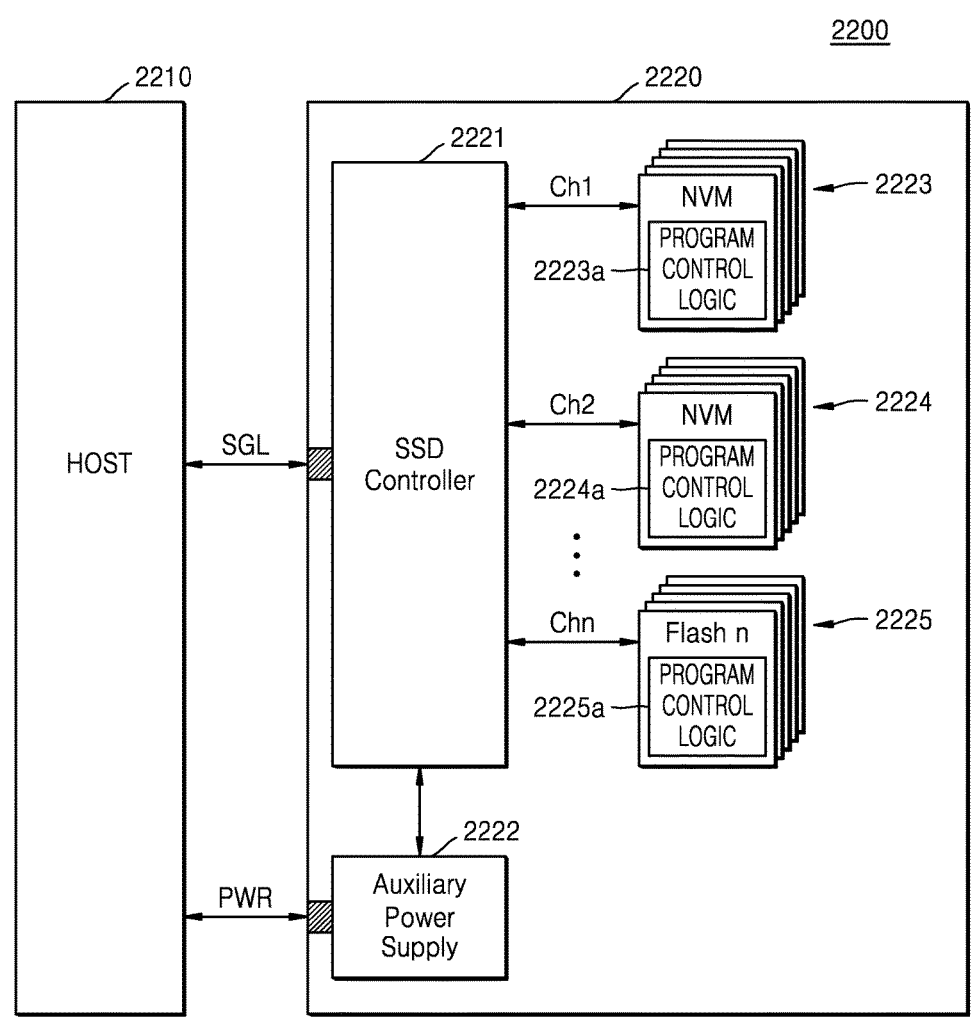
FIG. 22 is a block diagram illustrating an example in which non-volatile memory devices according to at least some example embodiments of the inventive concepts are applied to a solid state drive (SSD) system.

FIG. 22 is a block diagram illustrating an example in which the non-volatile memory devices according to at least some example embodiments of the inventive concepts are applied to a solid state drive (SSD) system.

Referring to FIG. 22, an SSD system 2200 may include a host 2210 and an SSD 2220. The SSD 2220 exchanges a signal with the host 2210 through a signal connector and receives power through a power connector. The SSD 2220 may include an SSD controller 2221, an auxiliary power supply 2222, and a plurality of non-volatile memory devices 2223, 2224, and 2225.

Each of the plurality of non-volatile memory devices 2223, 2224, and 2225 may be implemented using the embodiments illustrated in FIGS. 1 to 20. The non-volatile memory devices 2223, 2224, and 2225 include program control logics 2223a, 2224a, and 2225a, respectively, which control so that a first pass voltage is applied to unselected word lines of word lines during a first interval, a second pass voltage higher than the first pass voltage is applied thereto during a second interval, a discharge voltage lower than a program voltage is applied to a selected word line of the word lines after the program voltage is applied thereto during the first interval, and the program voltage is applied thereto during the second interval, in a program operation. The program control logics 2223a, 2224a, and 2225a may adjust the discharge voltage and/or the second pass voltage based on a level of the program voltage and a coupling rate between the selected word line and the unselected word lines.

Figure 23:
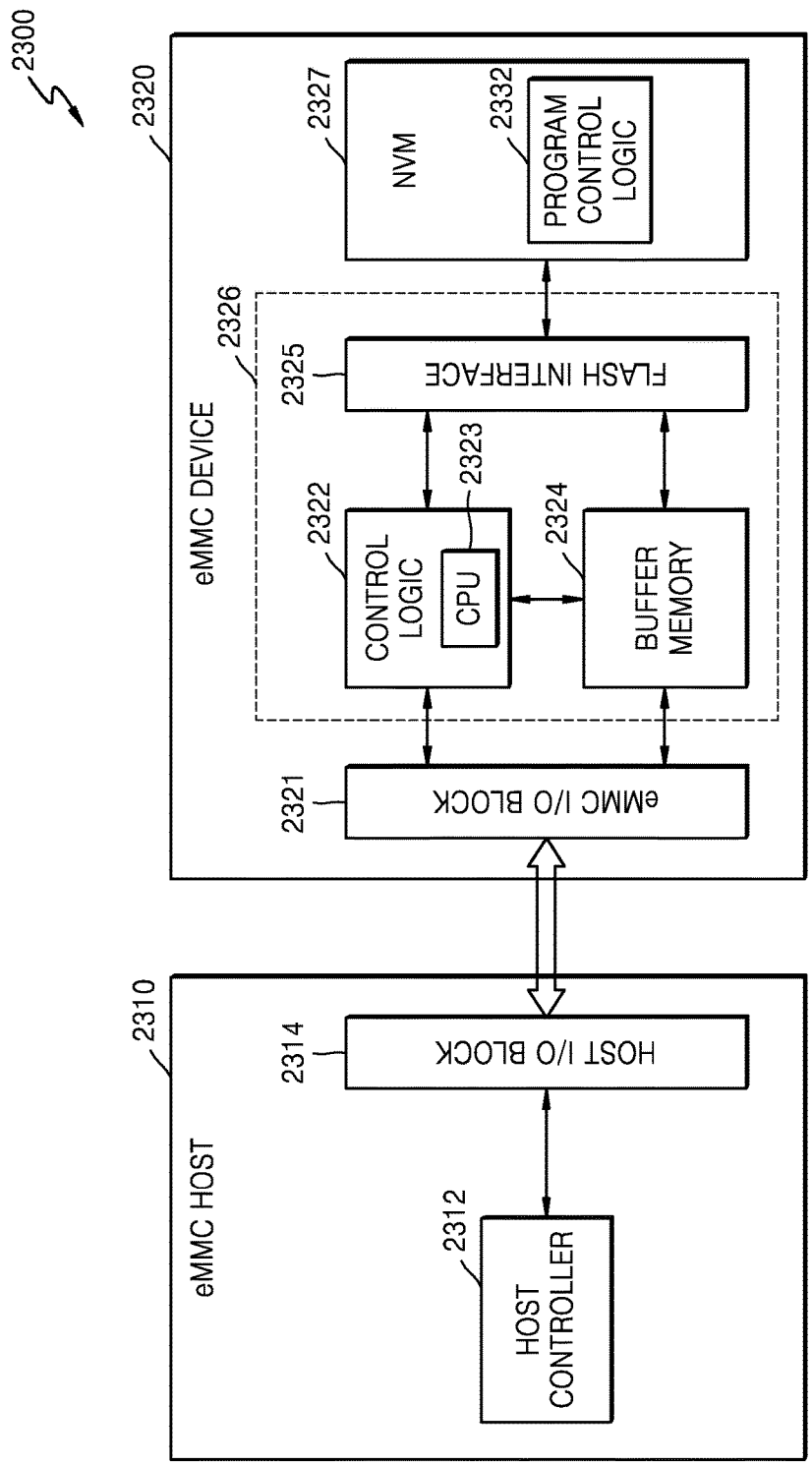
FIG. 23 is a block diagram for describing an embedded multi-media card (eMMC) system including non-volatile memory devices according to at least some example embodiments of the inventive concepts.

FIG. 23 is a block diagram for describing an eMMC system including the non-volatile memory devices according to at least some example embodiments of the inventive concepts.

Referring to FIG. 23, an eMMC system 2300 includes an eMMC host 2310 and an eMMC device 2320. The eMMC host 2310 and the eMMC device 2320 may be connected through an eMMC interface.

The eMMC host 2310 may refer to a microprocessor or an application processor, and the microprocessor or the application processor may be embedded or implemented in an electronic device. The electronic device may be implemented as a personal computer (PC), a laptop computer, a mobile phone, a smart phone, a tablet PC, a personal digital assistant (PDA), an enterprise digital assistant (EDA), a digital camera, a portable multimedia player (PMP), a portable navigation device (PND), an MP3 players, an e-book, or the like.

The eMMC host 2310 may control a data processing operation of the eMMC device 2320, for example, a data read operation, a data write operation, and the like. The eMMC host 2310 may include a host controller 2312 and a host I/O block 2314. During a data read operation, the host controller 2312 may receive data, which is read from a non-volatile memory device 2327 of the eMMC device 2320, through the host I/O block 2314. During a data write operation, the host controller 2312 may transmit data to be written to the non-volatile memory device 2327 of the eMMC device 2320 to the host I/O block 2314.

The eMMC host 2310 may generate a clock signal to be used in the eMMC device 2320 of the eMMC host 2310 and provide the generated clock signal to the eMMC device 2320. Further, the eMMC host 2310 may generate input and output voltages to be used in the host controller 2312 and provide the generated input and output voltages to the host controller 2312, and may generate core operation voltages to be used in the non-volatile memory device 2327 of the eMMC device 2320 and provide the generated core operation voltages to the eMMC device 2320.

The eMMC device 2320 may be implemented as a multi-chip package including an eMMC I/O block 2321, a control logic block 2322, a buffer memory 2324, a memory interface 2325, and the non-volatile memory device 2327. The control logic block 2322 including a central processing unit (CPU) 2323, the buffer memory 2324, and the memory interface 2325 may operate as an eMMC controller 2326 which controls data communication between the eMMC host 2310 and the non-volatile memory device 2327.

During a data write operation, data received through the eMMC I/O block 2321 may be temporarily stored in the buffer memory 2324 by the control of the CPU 2323. The memory interface 2325 may read the data stored in the buffer memory 2324 and write the read data to the non-volatile memory device 2327 by the control of the CPU 2323.

During a data read operation, the memory interface 2325 may store data output from the non-volatile memory device 2327 in the buffer memory 2324 by the control of the CPU 2323. The data stored in the buffer memory 2324 may be transmitted to the host I/O block 2314 through the eMMC I/O block 2321 by the control of the CPU 2323.

The non-volatile memory device 2327 in the eMMC system 2300 may be implemented using the embodiments illustrated in FIGS. 1 to 20. The non-volatile memory device 2327 includes a program control logic 2332 which controls so that a first pass voltage is applied to unselected word lines of word lines during a first interval, a second pass voltage higher than the first pass voltage is applied thereto during a second interval, a discharge voltage lower than a program voltage is applied a selected word line of the word lines after the program voltage is applied thereto during the first interval, and the program voltage is applied thereto during the second interval, in the program operation. The program control logic 2332 may adjust the discharge voltage and/or the second pass voltage based on a level of the program voltage and a coupling rate between the selected word line and the unselected word lines.

Figure 24:
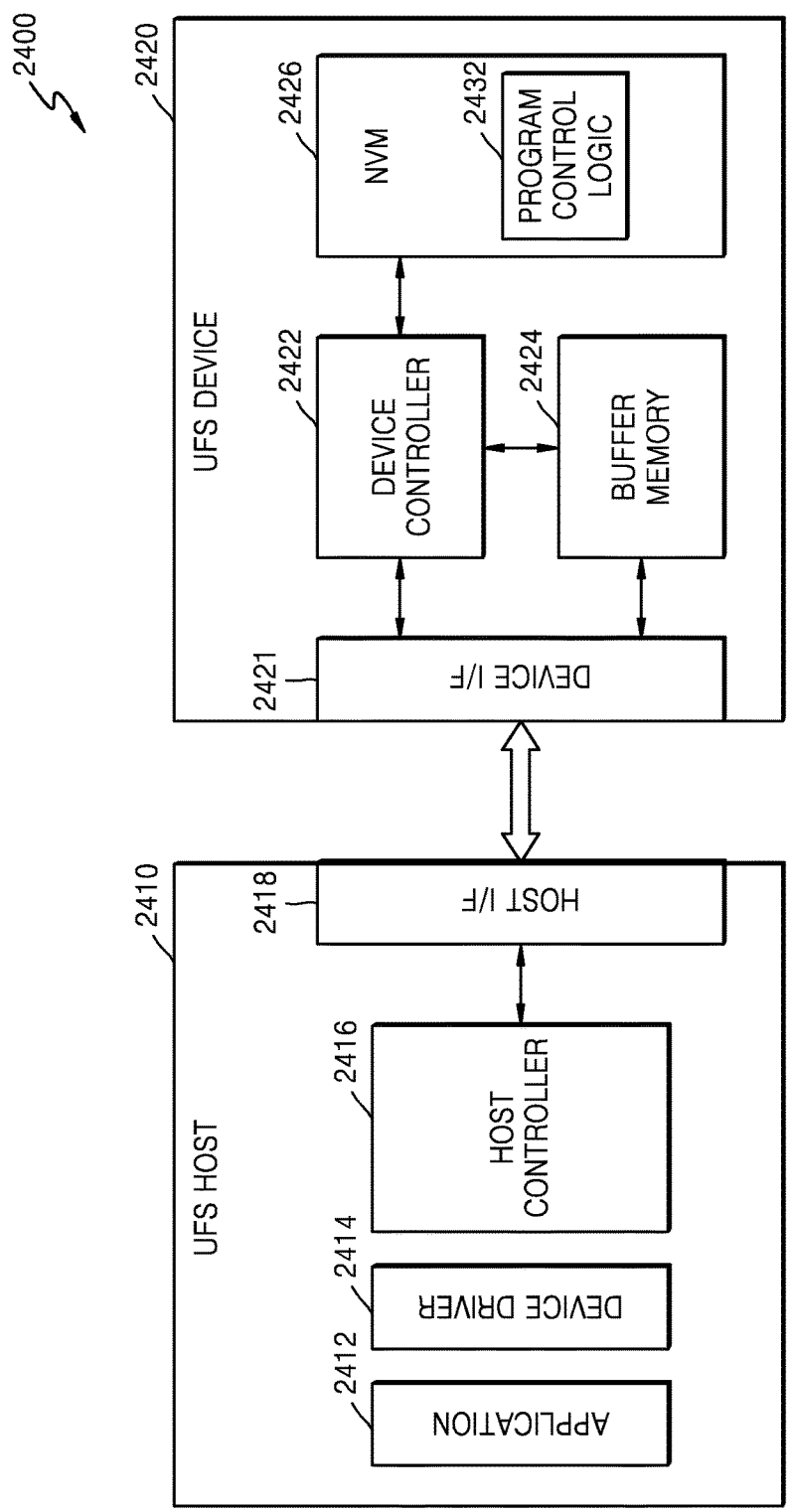
FIG. 24 is a block diagram for describing a universal flash storage (UFS) system including non-volatile memory devices according to at least some example embodiments of the inventive concepts.

FIG. 24 is a block diagram for describing a UFS system including the non-volatile memory devices according to at least some example embodiments of the inventive concepts.

Referring to FIG. 24, a UFS system 2400 includes a UFS host 2410 and a UFS device 2420. The UFS host 2410 and the UFS device 2420 may be connected through a UFS interface. The UFS system 2400 may be formed based on a flash memory which is a non-volatile memory device, and may be mainly used in a mobile device such as a smart phone.

The UFS host 2410 may include an application 2412, a device driver 2414, a host controller 2416, and a host interface 2418. The application 2412 is one of various application programs executed in the UFS host 2410. The device driver 2414, which is a driver for driving peripheral devices which are connected to and used in the UFS host 2410, may drive the UFS device 2420. The application 2412 and the device driver 2414 may be implemented through software, firmware, or the like.

The host controller 2416 may generate a protocol or a command to be provided to the UFS device 2420 according to requests of the application 2412 and the device driver 2414, and provide the generated command to the UFS device 2420 through the host interface 2418. The host controller 2416 provides a write command and data to the UFS device 2420 through the host interface 2418 when receiving a write request from the device driver 2414, and provides a read command to the UFS device 2420 through the host interface 2418 and receives data from the UFS device 2420 when receiving a read request therefrom.

The UFS device 2420 may be connected to the UFS host 2410 through the device interface 2421. The host interface 2418 and the device interface 2421 may be connected through a data line for transmitting and receiving data or through a signal and a power line for providing power.

The UFS device 2420 may include a device controller 2422, a buffer memory 2424, and a non-volatile memory device 2426. The device controller 2422 may control overall operation of the non-volatile memory device 2426 such as a write operation, a read operation, an erase operation, and the like. The device controller 2422 may exchange data with the buffer memory 2424 or the non-volatile memory device 2426 through an address and a data bus. The device controller 2422 may include a CPU, a device direct memory access (DMA), a flash DMA, a command manager, a buffer manager, a flash translation layer (FTL), a flash manager, and the like.

The UFS device 2420 may provide a command received from the UFS host 2410 to the device DMA and the command manager through the device interface 2421, and the command manager may assign the buffer memory 2424 so as to receive data through the buffer manager and send a response signal to the UFS host 2410 when data transmission preparing is completed.

The UFS host 2410 may transmit the data to the UFS device 2420 in response to the response signal. The UFS device 2420 may store the transmitted data in the buffer memory 2424 through the device DMA and the buffer manager. The data stored in the buffer memory 2424 may be provided to the flash manager through the flash DMA, and the flash manager may store the data at a selected address of the non-volatile memory device 2426 with reference to address mapping information of the FTL.

The UFS device 2420 may send the response signal to the UFS host 2410 and notify the UFS host 2410 of a command completion through the device interface 2421 when the data transfer required for the command of the UFS host 2410 and the program are completed. The UFS host 2410 may notify the device driver 2414 and the application 2412 of whether or not receiving of the response signal of the command is completed, and complete the corresponding command.

The non-volatile memory device 2426 in the UFS system 2400 may be implemented using the embodiments illustrated in FIGS. 1 to 20. The non-volatile memory device 2426 includes a program control logic 2432 which controls so that a first pass voltage is applied to unselected word lines of word lines during a first interval, a second pass voltage higher than the first pass voltage is applied thereto during a second interval, a discharge voltage lower than a program voltage is applied to a selected word line of the word lines after the program voltage is applied thereto during the first interval, and the program voltage is applied thereto during the second interval, in a program operation. The program control logic 2432 may adjust the discharge voltage and/or the second pass voltage based on a level of the program voltage and a coupling rate between the selected word line and the unselected word lines.

The above-described example embodiments of the inventive concepts may be implemented through a program that is stored on a computer-readable storage medium and includes computer-executable instructions corresponding to the operations described herein as being performed by some or all components of at least some example embodiments of the inventive concepts.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A programming method of a non-volatile memory device including a plurality of memory cells arranged in a plurality of cell strings, the method comprising:
   sequentially applying a first pass voltage to unselected word lines of word lines connected to the plurality of memory cells during a first interval and a second pass voltage higher than the first pass voltage to the unselected word lines during a second interval; and
   applying a discharge voltage lower than a program voltage to a selected word line of the word lines connected to the plurality of memory cells after applying the program voltage to the selected word line in the first interval, and applying the program voltage to the selected word line during the second interval.

2. The method of claim 1, further comprising:
   determining the discharge voltage based on a level of the program voltage and a coupling rate between the selected word line and the unselected word lines.

3. The method of claim 1, further comprising:
   adjusting an interval in which the discharge voltage is applied to the selected word line according to a level of the program voltage.

4. The method of claim 3, wherein the adjusting includes lengthening the interval in which the discharge voltage is applied, when the level of the program voltage increases.

5. The method of claim 1, further comprising:
   adjusting a time point at which the discharge voltage is applied to the selected word line according to a level of the program voltage.

6. The method of claim 5, wherein the adjusting includes advancing the time point at which the discharge voltage is applied, when the level of the program voltage is increased.

7. The method of claim 1, further comprising:
   adjusting a level of the discharge voltage according to a level of the program voltage.

8. The method of claim 7, wherein the adjusting includes increasing the level of the discharge voltage when the level of the program voltage is increased.

9. The method of claim 1, further comprising:
   adjusting a level of the second pass voltage according to a level of the program voltage.

10. The method of claim 9, wherein the adjusting includes increasing the level of the second pass voltage, when the level of the program voltage is increased.

11. A non-volatile memory device comprising:
    a memory cell array including a plurality of memory cells arranged in a plurality of cell strings;
    an address decoder that is,
       connected to the plurality of memory cells of the plurality of cell strings through a plurality of word lines,
       connected to string selection transistors of the plurality of cell strings through a string selection line, and
       connected to ground selection transistors of the plurality of cell strings through a ground selection line; and
    a program control logic configured cause, in a program operation,
       a first pass voltage to be applied to unselected word lines of the plurality of word lines during a first interval,
       a second pass voltage higher than the first pass voltage to be applied to the unselected word lines during a second interval,
       a discharge voltage lower than a program voltage to be applied to a selected word line of the word lines after the program voltage is applied to the selected word line during the first interval, and
       the program voltage to be applied to the selected word line during the second interval.

12. The device of claim 11, wherein the program control logic is configured to adjust the discharge voltage or the second pass voltage based on a level of the program voltage and a coupling rate between the selected word line and the unselected word lines.

13. The device of claim 11, wherein the memory cell array includes a three-dimensional (3D) memory array.

14. The device of claim 13, wherein the 3D memory array includes the plurality of memory cells, wherein each memory cell of the plurality of memory cells includes a charge trapping layer.

15. The device of claim 13, wherein:
    the 3D memory array includes a non-volatile memory formed at a physical level of at least one of memory cells having an active area disposed on a silicon substrate in a monolithic manner; and
    word lines and/or bit lines in the 3D memory array are shared between levels.

16. A method comprising:
    selecting a word line, from among a plurality of word lines of a non-volatile memory device, each word line of the plurality of word lines being connected to memory cells from among a plurality of non-volatile memory cells of the non-volatile memory device; and
    performing, over first, second, and third sequential time intervals, a programming operation on memory cells connected to the selected word line by,
       applying a program voltage to the selected word line during the first time interval, applying a discharge voltage that is lower than the program voltage to the selected word line during the second time interval, and applying a voltage that is higher than the discharge voltage to the selected word line during the third time interval, and
       applying a first pass voltage to unselected word lines during the first time interval, applying a second pass voltage that is higher than the first pass voltage to the unselected word lines during the third time interval, and applying the first pass voltage to the unselected word lines during the second time interval, the unselected word lines being word lines, from among the plurality of word lines, other than the selected word line.

17. The method of claim 16, wherein the voltage applied to the selected word line during the third time interval is the program voltage.

18. The method of claim 16, wherein the plurality of memory cells includes memory cells of each of a plurality of cell strings of a memory cell array of the non-volatile memory device.

19. The method of claim 16 further comprising:

verifying threshold voltage states of memory cells connected to the selected word line by applying one or more verification voltages to the selected word line after the first, second and third time intervals.

\* \* \* \* \*